(12) United States Patent
Gundel et al.

(10) Patent No.: US 9,692,476 B2
(45) Date of Patent: Jun. 27, 2017

(54) WIRELESS CONNECTORS

(71) Applicant: 3M INNOVATIVE PROPERTIES COMPANY, St. Paul, MN (US)

(72) Inventors: Douglas B. Gundel, Cedar Park, TX (US); Zulfiqar A. Khan, Austin, TX (US); Alexander W. Barr, Austin, TX (US); Steven A. Neu, Cedar Park, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 14/387,418

(22) PCT Filed: Apr. 4, 2013

(86) PCT No.: PCT/US2013/035188
§ 371 (c)(1),
(2) Date: Sep. 23, 2014

(87) PCT Pub. No.: WO2013/162844
PCT Pub. Date: Oct. 31, 2013

(65) Prior Publication Data
US 2015/0085903 A1    Mar. 26, 2015

Related U.S. Application Data

(60) Provisional application No. 61/638,172, filed on Apr. 25, 2012.

(51) Int. Cl.
*H04B 1/40* (2015.01)
*H05K 1/02* (2006.01)
(Continued)

(52) U.S. Cl.
CPC .............. *H04B 1/40* (2013.01); *H04B 1/3827* (2013.01); *H04B 10/803* (2013.01);
(Continued)

(58) Field of Classification Search
CPC .. A63F 13/00; G02B 6/42; G02B 6/43; G08B 13/14; G08B 13/187; G08B 23/00;
(Continued)

(56) References Cited

U.S. PATENT DOCUMENTS 6,093,888 A * 7/2000 Laureanti ............... H04B 15/00
174/387
6,278,864 B1 * 8/2001 Cummins ......... H04W 52/0274
455/260

(Continued)

OTHER PUBLICATIONS

PCT International Search Report for PCT/US2013/035188 mailed Aug. 16, 2013, 7 pages.
Saha, P.K. et al. "A 2.4 GHz Differential Wavelet Generator in 0.18 μm Complementary Metal-Oxide-Semiconductor for 1.4 Gbps Ultra-Wideband Impulse Radio in Wireless Inter/Intra-Chip Data Communication", Japanese Journal of Applied Physics, The Japan Society of Applied Physics, Tokyo, JP, vol. 45, No. 4B, Apr. 1, 2006, pp. 3279-3285.

(Continued)

*Primary Examiner* — Shawkat M Ali
(74) *Attorney, Agent, or Firm* — Robert S. Moshrefzadeh

(57) ABSTRACT

A wireless connector includes a plurality of printed circuit boards (PCBs) (901, 902) disposed within a housing of the electronic system. Each PCB comprises a plurality of transceivers (910a, 910b, 920a, 920b) configured to wirelessly transmit and receive modulated carrier signals (910, 920). Each transceiver in the system is configured to receive signals transmitted by every other transceiver in the system.

19 Claims, 25 Drawing Sheets

(51) Int. Cl.

| | |
|---|---|
| *H04B 10/80* | (2013.01) |
| *H04B 1/3827* | (2015.01) |
| *H05K 1/14* | (2006.01) |
| *H04B 5/00* | (2006.01) |
| *H04B 7/0413* | (2017.01) |
| *H05K 3/36* | (2006.01) |

(52) U.S. Cl.
CPC ......... *H05K 1/0239* (2013.01); *H05K 1/0243* (2013.01); *H04B 5/0037* (2013.01); *H04B 5/0075* (2013.01); *H04B 7/0413* (2013.01); *H05K 1/144* (2013.01); *H05K 3/366* (2013.01); *H05K 2201/042* (2013.01); *H05K 2201/047* (2013.01); *H05K 2201/10098* (2013.01)

(58) Field of Classification Search
CPC ........... H01Q 13/24; H01P 11/00; H04B 1/16; H04B 1/28; H04B 1/3827; H04B 1/38; H04B 1/40; H04B 5/00; H04B 7/00; H04B 7/24; H04B 10/00; H04B 10/803; H04L 12/26; H04L 12/413; H04M 1/00; H05K 1/0243; H05K 1/0293; H04W 72/04; H04W 88/02
USPC ................. 340/5.2, 10.4, 10.5, 572.1, 572.6; 343/702, 776, 785, 867; 370/229, 329, 370/338; 375/219, 220; 455/39, 41.1, 455/73, 90.3, 333, 334, 566; 700/94
See application file for complete search history.

(56) References Cited

U.S. PATENT DOCUMENTS

| | | | |
|---|---|---|---|
| 6,856,788 | B2 | 2/2005 | Chang et al. |
| 7,598,923 | B2 | 10/2009 | Hardacker et al. |
| 7,671,803 | B2 * | 3/2010 | Neill ........................ H01Q 1/38 343/700 MS |
| 7,733,287 | B2 | 6/2010 | Hardacker |
| 8,508,236 | B2 | 8/2013 | Weitemeier et al. |
| 2001/0044290 | A1 * | 11/2001 | Bobier .................... H01Q 1/246 455/301 |
| 2003/0114898 | A1 * | 6/2003 | Von Arx .................. A61N 1/08 607/60 |
| 2006/0290377 | A1 | 12/2006 | Kim et al. |
| 2008/0238796 | A1 * | 10/2008 | Rofougaran ........... H01Q 1/005 343/776 |
| 2008/0298242 | A1 | 12/2008 | Fan et al. |
| 2009/0175323 | A1 * | 7/2009 | Chung .................... H01L 23/48 375/220 |
| 2010/0069004 | A1 | 3/2010 | Bloebaum |
| 2010/0073243 | A1 * | 3/2010 | Ayala Vazquez ........ H01Q 1/02 343/702 |
| 2010/0159829 | A1 | 6/2010 | McCormack |
| 2011/0243074 | A1 | 10/2011 | Shin et al. |
| 2013/0169466 | A1 | 7/2013 | Frederick |

\* cited by examiner

WIRELESS CONNECTORS

BACKGROUND

Currently, printed circuit boards (PCBs) within an electronic system are typically connected to one another via wired copper connectors either directly or in conjunction with flexible conducting cables. In some cases, particularly where high data transmission speeds are employed, optical cables are also used. Designing these connectors and cables becomes increasingly challenging as the number and the data rates of the connections are increased. The limited available real estate on printed circuit boards (PCBs) further poses significant challenges to designing optimal connector foot prints on the boards. These challenges lead to increased product development time and cost. Connections are a major source for many system level problems, including signal integrity and electromagnetic interference. Even if a given board-to-board connection can be successfully designed, it cannot be easily extended to other scenarios. Further, it is generally not possible to increase complexity of the same system, e.g. addition or restructuring of a PCB, without significant efforts by the system designer.

SUMMARY

In some of the described embodiments, a wireless connector includes a first communication device and a second communication device. The first communication device is configured to wirelessly transmit, by radiative coupling, a modulated signal comprising a carrier signal modulated with a digital signal. The second communication device is configured to receive the modulated signal. The first and second communication devices are coupled through at least one wired connection that carries a signal used to demodulate the modulated signal.

Some embodiments involve a wireless transceiver system that includes a first printed circuit board (PCB) comprising a first transceiver assembly disposed thereon The first transceiver assembly includes a first modulator for modulating a first carrier signal with a first digital signal to generate a first modulated carrier signal and a first transmitter for wirelessly transmitting the first modulated carrier signal. The wireless transceiver system includes a second PCB comprising a second transceiver assembly disposed thereon. The second transceiver assembly comprises a first receiver for wirelessly receiving the wirelessly transmitted first modulated carrier signal and a first demodulator for demodulating the received first modulated carrier signal to extract the first digital signal. The first transceiver assembly and the second transceiver assembly are connected through at least one wired connection that carries a signal used in demodulating the received first modulated carrier signal.

Some embodiments are directed to wireless transceiver system that includes first and second PCBs. The first PCB comprises a plurality of first transceivers disposed thereon. Each first transceiver is adapted to modulate a first carrier signal with a first digital signal to generate a first modulated carrier signal and wirelessly transmit the first modulated carrier signal. The second PCB comprises a plurality of second transceivers disposed thereon. Each second transceiver is adapted to modulate a second carrier signal with a second digital signal to generate a second modulated carrier signal and wirelessly transmit the second modulated carrier signal. Each first transceiver corresponds to a different second transceiver and each first transceiver is adapted to wirelessly receive the second modulated signal wirelessly transmitted by the second transceiver corresponding to the first transceiver and demodulate the received second modulated carrier signal to extract the second digital signal. Each second transceiver is adapted to wirelessly receive the first modulated signal wirelessly transmitted by the first transceiver corresponding to the second transceiver and demodulate the received first modulated carrier signal to extract the first digital signal.

In some embodiment, an insulating structure is disposed between the first PCB and the second PCB.

Some embodiments involve an electronic system that includes a plurality of printed circuit boards (PCBs) disposed within a housing of the electronic system. Each PCB comprises a plurality of transceivers configured to wirelessly transmit and receive modulated carrier signals. Each transceiver in the system is configured to receive signals transmitted by every other transceiver in the system.

In some embodiments, an electronic system includes a housing with multiple sections within the housing and a plurality of transceivers arranged within each of the multiple sections. The plurality of transceivers are disposed on one or more printed circuit boards (PCBs). Each of the transceivers of the plurality of transceivers is configured to transmit and receive modulated carrier signals modulated by digital data. Each of the plurality of transceivers are arranged within each section is configured to receive modulated carrier signals transmitted by each of the other transceivers of the plurality of transceivers.

In some embodiments, an electronic system includes a plurality of printed circuit boards (PCBs). Each PCB comprises a first transceiver configured to wirelessly transmit a first carrier signal modulated by a first signal. The electronic system includes a cable spaced apart from each PCB of the plurality of PCBs and comprises a plurality of spaced apart radiation points disposed thereon. Each radiation point is adapted to wirelessly transmit a second carrier signal modulated by a second digital signal and to receive the first carrier signal modulated by the first digital signal.

DESCRIPTION

Wireless connection of PCBs can be used to reduce or eliminate many of the problems described above. Communication using the extremely high frequency (EHF) (millimeter band) can be used for communication over short distances. Some embodiments discussed herein involve point-to-point or wireless network connectors communicatively coupling printed circuit boards (PCBs), devices on the same PCB, and/or other short-range communication applications. These embodiments are applicable to communication between devices of a system, e.g., devices disposed within the system chassis (also referred to herein as the system housing). The wireless connectors discussed herein can potentially replace or reduce the need for wired connectors for medium to high speed communication between boards or between the devices on the same board. These implementations provide very attractive solutions to the increasingly complex connectivity problems in a multi-board system (e.g., instruments, PCs, consumer devices, industrial equipment, and data centers.)

Figure 1A:
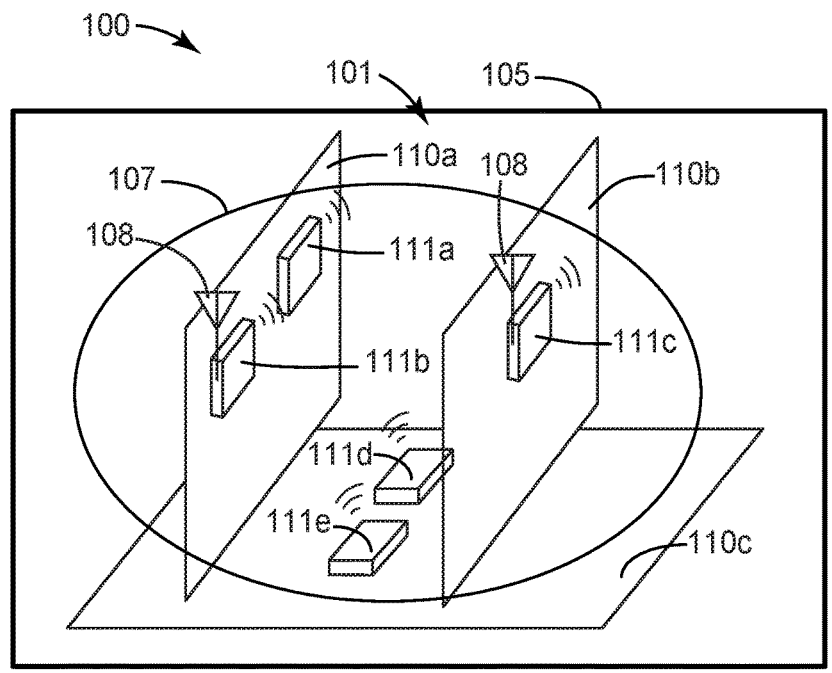
FIG. 1A provides an illustration of one embodiment of a wireless connector in an electronic system that includes three printed circuit boards (PCBs)

FIG. 1A provides an illustration of one embodiment where the electronic system 100 includes three printed circuit boards (PCBs) 110a, 110b, 110c. The three PCBs 110a, 110b, 110c are disposed within a chassis 105. Each PCB 110a, 110b, 110c includes one or more wireless communication devices 111a-e which wirelessly send and receive signals. In this configuration, the three PCBs 110a, 110b, 110c are communicatively coupled through the wireless connector 101 which communicates in wireless network 107. For example, the wireless communication devices (communicating chips) may act as receivers, transmitters, and/or transceivers. A transmitter or receiver modulates a carrier signal using a data signal, such as a digital data signal, and transmits the signal, e.g. by radiative coupling or by passive coupling. A receiver or transceiver receives the modulated signal, demodulates the modulated signal, and extracts the digital data. Although three PCBs 110a, 110b, 110c are shown in FIG. 1, it will be understood that the electronic system may include more or fewer than three PCBs. Furthermore, some of the PCBs in the system may not be wirelessly connected to the other PCBs through a wireless connector.

For example, in some cases, the electronic system may only include a single PCB within the chassis, and the single PCB may include multiple communication devices 111a-e that wirelessly communicate through the network. For example, in some configurations, every communication device in a network wirelessly communicates with every other device. The communication devices 111a-e may comprise wireless communication integrated circuits (ICs) (or "chips") communicating in the EHF band which ranges from 30 to 300 GHz.

In some implementations, the wireless network connector 101 allows any communication chip 111a-e in the network to communicate to any other communication chip 111a-e in the network 107. In other words, communication chip 111a can receive information from chips 111b-e and/or communication chip 111a can transmit information to chips 111b-e. According to some embodiments, each chip 111a-e can have a unique address within the network. The unique address is included in the communications between the chips and allows each chip to receive information intended for it, while ignoring information intended for other chips. If unique addressing is used, each of the communication chips may transmit at the same carrier frequency.

In some embodiments, each of the chips may transmit and/or receive information on a carrier frequency that is different from the carrier frequency used by other chips. Note that it is possible for a chip to be configured to transmit information using one carrier frequency and to receive information transmitted on another carrier frequency. Using different transmit frequencies may allow the source of the communication to be identified. Using different receive frequencies allows communications to be directed to specific communication devices that are "listening" for that frequency. Using different transmit and receive frequencies may also be used to reserve some frequencies for sending control signals and other frequencies for sending the data. This scheme of using different frequencies also allows simultaneous communication from all transmitters and receivers. In various embodiments, each transceiver on the PCB and/or operating in a network may transmit the same carrier frequency modulated with the same digital data, the same carrier frequency modulated with different digital data, a different carrier frequency modulated with the same digital data, or a different carrier frequency modulated with different modulating data.

The communication devices 111a-111e may optionally operate in a master-slave configuration, wherein one of the communication chips, e.g., 111e operates as the master device for the network and controls the communication of the other chips 111a-111d. In some approaches, there may not be a network master, and the chips may operate independently and compete for the communication channel, either equally, or according to some priority scheme. In schemes wherein the boards compete to claim the wireless channel, channel access techniques such as Aloha, slotted Aloha, p-persistent Aloha, 1-persistent Aloha, Token Ring, Carrier sense multiple access, Carrier sense multiple access with collision detection/avoidance and/or other such techniques may be used.

Communication signals in wireless connectors can be transmitted using electromagnetic radiative coupling from one or more transmit antennas to one or more receive antennas. Transmission by electromagnetic radiative coupling can be used for both wireless networked connectors, such as the wireless network connector 101 shown in FIG. 1A or in wireless point-to-point connectors discussed below. In some configurations, passive coupling by either inductive or capacitive coupling can be used to transmit the communication signal. Wireless connectors using passive coupling may be more suited to point-to-point connectors due to the low power communications. However, a wireless network connector can also be implemented using passive coupling. For example, network communication by passive coupling can be implemented if transceivers are arranged so that the signals transmitted by one of the transceivers can be received by passive coupling from the other transceivers in one configuration the arrangement of the passively coupled network may comprise an aligned stack of transceivers that are spaced so that each transceiver can receive the signals transmitted by another transceiver. In another configuration, the passively coupled transceivers may be arranged in a ring or daisy chain fashion, such that one of the transceivers receives data from an adjacent transceiver to which it is coupled on one side and processes the data to determine if the data was intended for the transceiver. If so, the transceiver further process the signal and does not pass the signal on, and if the signal was not meant for the transceiver, the transceiver passes the signal on to the next transceiver to which it is coupled on the other side in the chain. In another configuration, the transceivers are passively coupled to each other via a, inductive loop or via a comment capacitive patch, such that the data transmitted from one transceiver is received and processed by every other transceiver. The transceiver for which the data was intended, further processes the received data while other transceivers simply ignore the received data which was not intended for them Whether radiative or passive coupling is used, a carrier signal is generated at the transmitter and is modulated with the information (symbols) to be transmitted. In some implementations the information used to modulate the carrier signal is digital information. At the receiver, the signal received from the transmitter is demodulated and the symbols are extracted. The transmitter uses a clock which represents the frequency and exact timing of the transmission of the individual symbols. For example, in some cases, at the clock transitions, the transmitted carrier is at the correct value to represent a specific symbol. However, in other cases the clock may only help in synchronizing local digital signals but not in transmission of the signals.

In general, modulation may be accomplished using a variety of techniques, including analog and digital modulation techniques. The analog techniques may include techniques such as amplitude modulation (AM) and frequency/phase modulation (FM/PM). Analog techniques can be limited in the amount of information that can be carried through the connector. In some cases, digital modulation techniques may be used to increase the carrying capacity of the wireless connector. Digital communication modulation schemes such as quadrature phase shift keying (QPSK), frequency shift keying (FSK), minimum shift keying (MSK), and/or quadrature amplitude modulation (QAM) may be used. In some digital communication modulation schemes both amplitude modulation and phase modulation are used together.

Additionally, these digital modulation techniques may be used in conjunction with multiplexing (also known as multiple access) which provide different ways to add diversity to signals and that allow the signals to be separated from one another. Multiplexing also allows optimal utilization of the channel bandwidth. Suitable multiplexing techniques include time division multiple access (TDMA), code division multiple access (CDMA), and orthogonal frequency division multiplexing (OFDM). In addition, spatial signatures of the received signal may be exploited for multiplexing the data streams transmitted at the same carrier frequencies from a transmitter to a receiver.

In some modulation schemes, when the signal is modulated, the phase of the local carrier used for the modulation is known in the transmitter because these signals are generated inside the transmitter. For demodulation, the receiver has to generate a local carrier which must be in phase (or synchronized) with the carrier of the transmitter. In some cases, the carrier is recovered from the received signal. Clock recovery schemes or synchronizing the phase of the locally generated carrier require fairly complicated algorithms and/or electronic circuits. Alternatively, asynchronous detection schemes can be utilized but these require much higher power transmission levels and signal to noise ratios (SNRs).

Figure 1B:
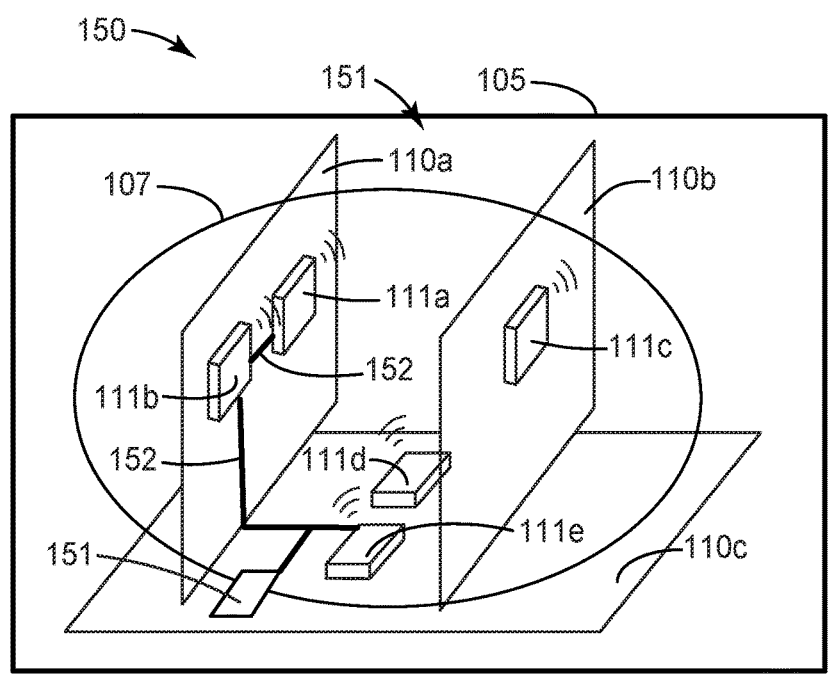
FIG. 1B illustrates a scenario for a wireless connector which is configured for synchronous communication using a shared clock and/or control signals.

FIG. 1B illustrates a scenario for a wireless connector 151 which is configured for synchronous communication. Because the distance between the communicating chips is small—in this case the chips are within the same chassis—there is the opportunity for the communicating chips to share the same clock signal and/or to share other channel synchronization and/or control signals, and/or to share power and/or ground. As illustrated in FIG. 1B, connector 151 provides a clock signal which is shared along traces 152 with multiple communication chips 111a, 111b, 111e. Sharing the channel control signals, such as the clock signal, simplifies the design by eliminating the need for complex clock recovery algorithms. In some embodiments, the signal shared via wired connection may be a clock signal, a channel synchronization signal, the control signal, or other signal useful for demodulating the received modulated signal. In addition power and/or ground may be shared through wired connections.

The wireless network connector may use a number of different diversity schemes for improving the reliability of signals. Diversity can reduce interference and errors in the signals. The concept of diversity is based on the fact that individual channels experience different levels of interference. Multiple versions of the same signal may be transmitted and/or received and combined in the receiver. Time diversity relates to versions of the same signal that are transmitted at different times. In frequency diversity, the signal is transmitted using several frequency channels or spread over a wide spectrum that is affected by frequency-selective noise. If space diversity is used, the signal is transmitted over several different propagation paths. In the case of wireless transmission, space diversity can be achieved by using multiple transmitter antennas (transmit diversity) and/or multiple receiving antennas (reception diversity). In reception diversity, the signals are combined before further signal processing occurs. In some embodiments one or more of the communication devices can use a multiple-input-multiple output (MIMO) technique with multiple antennas for the transmitter and the receiver. MIMO uses the same total transmit power over the antennas to improve the spectral efficiency of the array and thus provide more bits per second per hertz of bandwidth. The techniques of MIMO and communication diversity in general can improve the reliability of the communication link by compensating for interference, which can result in reduced fading and increased throughput.

In some implementations, a wireless network connector utilizes open system interfaces, which allows additional communication devices to be incorporated into the network. This approach is helpful if boards that include communication chips are frequently swapped in and out of the system. For example, if a communication chip which is new to the network is added, the network master, if present, will begin controlling communications of the new chip. In networks where there is no network master, the newly added communication chip can begin communicating with equal access to the channel or prioritized access if there is a priority scheme in place.

In some implementations, the wireless network connector operates a closed network. That is, the network only recognizes the communication devices in the network as configured, and the introduction of new communication devices is not allowed. A closed system can be useful when the application calls for increased integrity in data transmission and/or security.

FIGS. 1A and 1B show the use of wireless network connectors 101, 151 enclosed within a chassis and communicating in network wherein each of the communication devices potentially can communicate with any of the other communication devices. In some configurations, it may be more helpful to arrange the communication chips in pairs that wirelessly communicate with each other and do not communicate with other pairs—a scheme referred to herein as a wireless point-to-point connector. In the wireless point-to-point connector configurations communication chips in a pair communicate only with each other and any communication with other communication chips in the system is unintentional. Note that the communication devices in the pairs need not be one-to-one. For example, a communication device in a first pair may also be in a second pair.

Some of the implementations are particularly useful as a substitute for traditional board-to-board data connections that use mating mechanical-electrical wired connectors. In these traditional connectors, one half of the connector must be aligned with the other half of the connector, then pressed together to the right mating height to make the electrical connection. In addition, only a few of these connections are possible between boards since proper mating requires that all connectors be aligned to their complementary half and this becomes more difficult with greater separation of the boards and if there are a greater number of connectors. Also, a further limitation imposed by the use of only one or two mechanical connectors to connect two PCBs is that all signals that need to be routed between the boards need to be routed across the board to the connector (sometimes from relatively long distances) then routed away on the connecting board. The routing of traces to and from the wired connector uses a large amount of board space, constrains where the signal are routed from and to, and also can create signal integrity and electromagnetic interference issues as the signals are carried a large distance on the board. In addition, a connector family that provides a connection over a range of various heights requires tooling of several designs that provide this height range. Even with a discrete range of heights tooled for a given connector family, the height is not continuously variable and so any new arbitrary height might require tooling a new connector.

In embodiments disclosed herein wireless networked connectors and/or wireless point-to-point connectors, as disclosed in more detail below, may provide data transfer through air or another suitable medium. These wireless solutions can carry some or all of the data transfer that is needed between two PCBs. Wireless communication can transmitted on any suitable carrier frequency, but frequencies within the EHF band of 30-300 GHZ, such as 60 GHz, can be particularly useful for high bandwidth wireless data transmission. As used herein, the term "60 GHz" refers to the frequency band from about 57 GHz to about 64 GHz.

Implementation of wireless connectors allows a number of limitations of standard electrical-mechanical connectors to be overcome or reduced. The wireless point-to-point and wireless network connectors can be used together or separately. For example in some systems all connections may be made using one or more wireless point-to-point connectors, in some systems all connections may be made using one or more wireless network connectors, and in some systems a combination of one or more wireless point-to-point connectors and one or more wireless network connectors are used. The point-to-point and/or network wireless data connectors can be used alone or in combination with conventional wired connectors. For wireless connections, some mechanical coupling between communicating boards is generally needed to hold the boards in given relational position.

Figure 2:
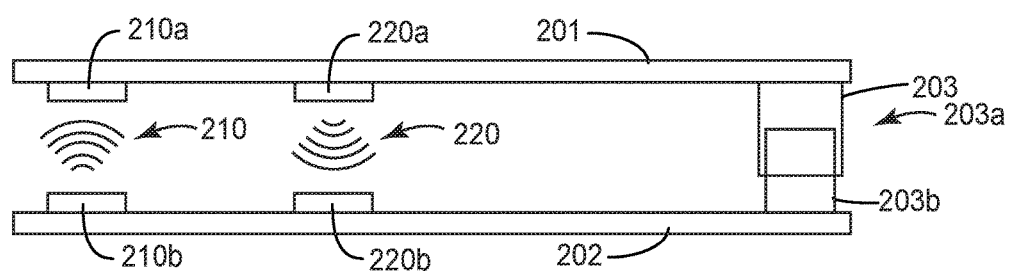
FIG. 2 illustrates wireless connectors used in combination with a wired electrical connector.

In some configurations, one or more wireless connectors may be used in combination with one or more wired electrical connectors as illustrated in FIG. 2. FIG. 2 shows two point-to-point wireless connections 210, 220. Each of the wireless connectors 210, 220 includes two communication chips 210*a*, 210*b*, 220*a*, 220*b*. According to the orientation of the PCBs as depicted in FIG. 2, communication chips 210*a*, 220*a* are disposed on the lower surface of PCB 201 and communication chips 210*b*, 220*b* are disposed on the upper surface of a PCB 202 so that the communicating pairs 210*a*, 210*b*, 220*a*, 220*b* face each other. In some implementations, corresponding communication devices may be those that are closest to one another. The paired communication devices 210*a*, 210*b*, 220*a*, 220*b* wirelessly communicate with each other. The communication chips 210*a*, 210*b*, 220*a*, 220*b* may be receiver-transmitter pairs, or both chips may be transceivers. The communication signals exchanged between the communication devices 210*a*, 210*b*, 220*a*, 220*b* can be transmitted by active electromagnetic radiative coupling from one or more transmit antennas to one or more receive antennas. In some implementations, the communication signal may be passively transmitted, e.g. using inductive or capacitive coupling as previously discussed. When either active or passive coupling is used, a carrier signal is generated at the transmitter chips 210*b*, 220*a* and is modulated with the information (symbols) to be transmitted. The receiver chips 210*a*, 220*b* receive the modulated signal, demodulate the signal, and extract the transmitted symbols. In the example of FIG. 2, a wired electrical connector 203 is also used. The wired electrical connector 203 is shown as a plug and socket type including first and second mating halves 203*a*, 203*b*. The wired electrical connector 203 mechanically connects the two PCBs 201, 202 together and may also be used to transfer power and/or data between the PCBs 201, 202.

In some cases, when more than one wireless connector 210, 220 is used in the same space there is a potential for cross talk or mutual electromagnetic interference between the wireless connectors 210, 220. To minimize or reduce crosstalk the spacing, S, between the wireless connectors should be made greater than the distance, D, between the chips that are communicating with each other. Distances greater than D between wireless connectors will yield less crosstalk, in general. However, this may only be true when PCBs 201 and 202 together do not form a cavity or waveguide due to conducting planes. This phenomenon occurs in some cases when the signal transmitted within one connector is reflected back and forth from the conductive backplanes or conductive surfaces on the two boards facing each other. These multiple reflections can sometimes add up to form signal resonances within the confined space between the two PCBs at certain frequencies. If so, then merely increasing the spacing S between two adjacent connectors may not be sufficient and other means such as noise mitigation/signal enhancement structures must be employed as explained in the coming paragraphs.

Figure 3:
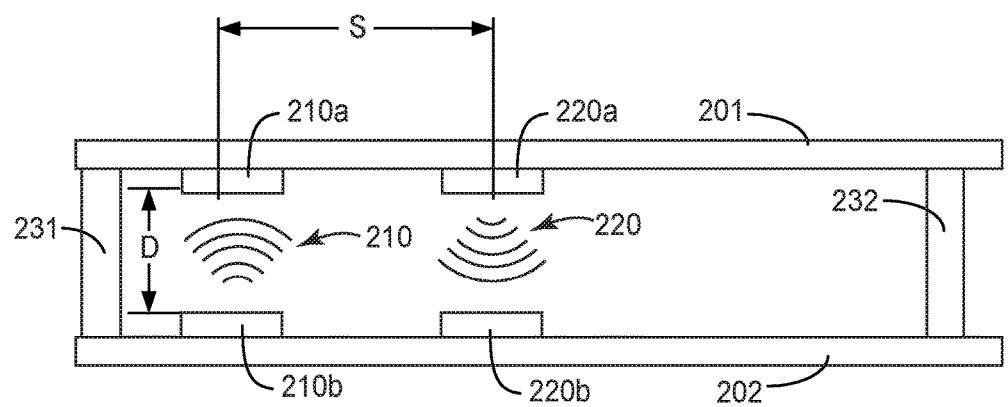
FIG. 3 illustrates spacers used to position two PCBs that wirelessly communicate through wireless connectors.

In some cases, other means can be used either additionally, or alternatively, to a wired electrical connector to mechanically connect and relatively position the boards. FIG. 3 shows spacers 231, 232 which provide mechanical connection between the boards 201, 202 and which serve to maintain a minimum distance between the communicating chips 210*a*, 210*b*, 220*a*, 220*b* of the wireless connectors 210, 220. Although these spacers 231, 232 can be rigid, they may have some flexibility or compressibility to allow relative motion when external forces are applied (vibration, drop, etc.) and then return the boards to their original positions when external forces are removed. Compressible spacers could allow the boards to absorb some of the external force or movement, while the wireless connection could remain intact during the exposure and also afterwards.

Figure 4:
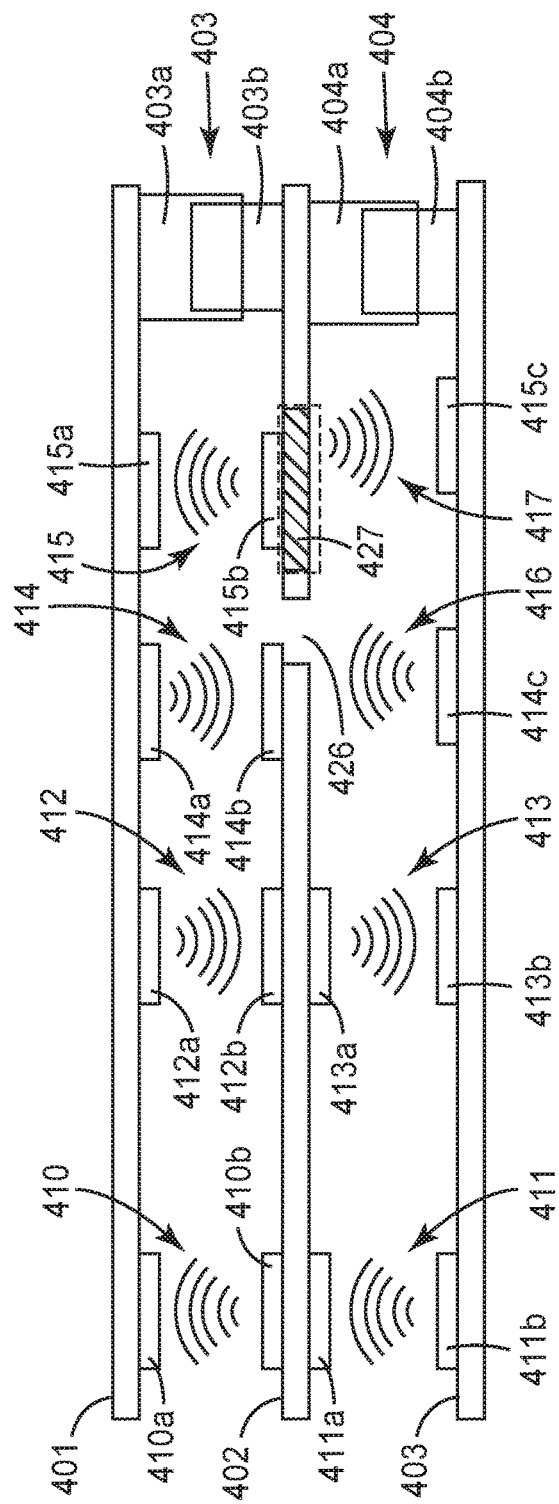
FIG. 4 illustrates three PCBs communicating through eight wireless connectors.

Note that wireless connections can be arranged so that more than two boards can communicate with each other as shown in FIG. 4. In the arrangement shown in FIG. 4, there are eight wireless point-to-point connectors 410, 411, 412, 413, 414, 415, 415, 416, 417 on three PCBs 401, 402, 403. Wireless connector 410 includes communication chips 410*a* and 410*b*; wireless connector 411 includes communication chips 411*a* and 411*b*; wireless connector 412 includes communication chips 412*a* and 412*b*; wireless connector 413 includes communication chips 413*a* and 413*b*; wireless connector 414 includes communication chips 414*a* and 414*b*; wireless connector 415 includes communication chips 415*a* and 415*b*; wireless connector 416 includes communication chips 414*b* and 414*c*; and wireless connector 417 includes communication chips 415*b* and 415*c*. In addition, wired electrical connector 403 mechanically and electrically couples PCB 401 to PCB 402. Wired electrical connector 403 includes mating receptacle 403*a* and socket 403*b*. Wired electrical connector 404 includes mating receptacle 404*a* and socket 404*b* and mechanically and electrically couples PCB 402 to PCB 403

Wireless connectors 410, 412, 414, 415 communicate between adjacent PCBs 401 and 402 and wireless connectors 411, 413, 416, and 417 communicate between adjacent PCBs 402 and 403. Wireless connectors 410-415 include chips in communicating pairs 410*a*, 410*b*, 411*a*, 411*b*, 412*a*, 412*b*, 413*a*, 413*b*, 414*a*, 414*b*, 415*a*, 415*b* which are disposed on facing surfaces of PCBs 401 and 402 or PCBs 402 and 403 so that the communicating pairs face each other.

Wireless connector 416 includes communication chips 414*b* and 414*c* which are not on facing surfaces of PCB boards 402 and 403 and must communicate through PCB 402. Wireless connector 417 includes communication devices 415*b* and 415*c* which are also are not on facing surfaces of PCBs 402 and 403. Communication devices 415*b* and 415*c* must communication through PCB 402. In some cases, the material of the PCB and/or ground planes, power planes and/or conductive traces disposed within or on the surface of a PCB may cause the PCB to attenuate the signal sent between communication devices that communicate through the PCB. Various techniques may be used to reduce the attenuation and allow the communication signal to pass through a PCB. For example, one technique is to provide an aperture 426 through the PCB that allows the communication signal from communication chip 414*b* to reach communication chip 414*c*, and vice versa. Another approach shown in FIG. 4 may be used if the dielectric material of the PCB itself does not substantially attenuate the communication signal. This approach involves clearing the PCB of conductors in a region 427 between communicating devices 415*b*, 415*c*.

In some implementations, it may be helpful to reduce the potential for noise and/or enhance signal integrity by providing a structure that directs the energy from a transmitting device to the intended receiving device in the wireless connector. The material and/or shape of the noise mitigation/signal enhancement structure can be selected to provide optimal crosstalk reduction. In various examples, as illustrated in FIGS. 5B through 5E, the shape of the noise mitigation/signal enhancement structure may take on any suitable solid or hollow shape. FIGS. 5B through 5E respectively show, a hollow circular tube (FIG. 5B), a hollow rectangular tube (FIG. 5C), a solid cylinder (FIG. 5B), and a solid box (FIG. 5E).

Figure 5A:
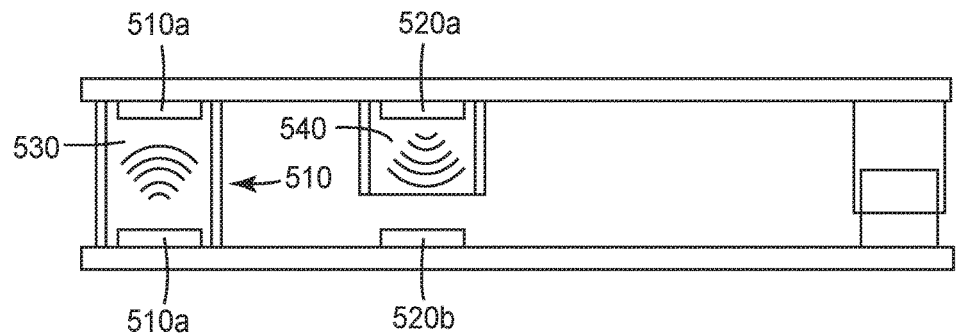
FIGS. 5A through 5E, illustrate the shape of various noise mitigation/signal enhancement structures.
Figure 5B:
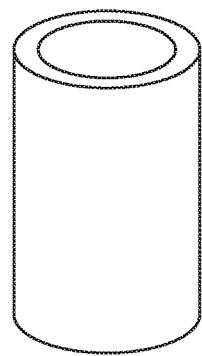
Figure 5C:
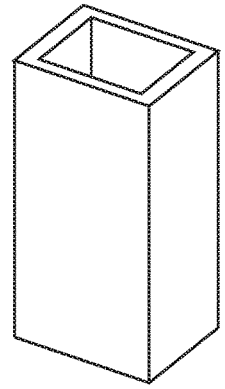
Figure 5D:
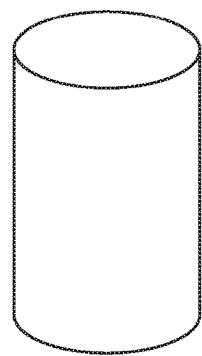
Figure 5E:
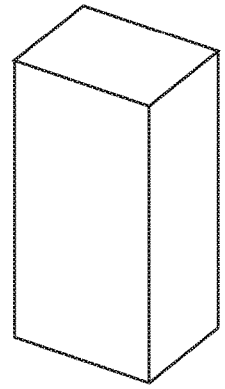

As shown in FIG. 5A, in some cases, a noise mitigation/signal enhancement structure 520, 530 may or may not extend all the way from one communication device 510*a*, 520*a* to the other 510*b*, 520*b* in a communication pair 510, 520. In some cases, as illustrated by wireless connector 510 in FIG. 5A, full coverage between the communication devices may be selected. In other cases, as illustrated by wireless connector 520 in FIG. 5A, only partial coverage may be used.

The material or materials for the noise mitigation/signal enhancement structure may be any materials that reduce crosstalk between communication pairs and or increase the signal-to-noise ratio (SNR) of the signal passed between communication device pairs of a wireless connector. For example, suitable materials may include metalized polymers, composites, low loss high permittivity materials, metal shells, and/or other materials. The noise mitigation/signal enhancement structures may be configured to limit the crosstalk from one wireless connector to the other wireless connector and/or to increase the effective data transfer distance from transmitter to receiver in a wireless connector. These noise mitigation/signal enhancement structures can be made to fit over the communication chips and/or can be adhered to the communication chips for mechanical retention and reduction of loss.

Figure 6:
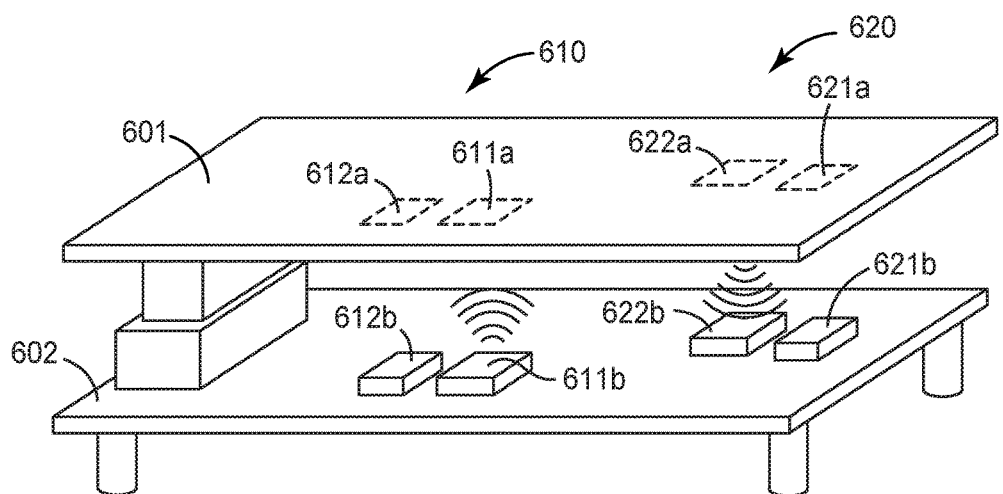
FIG. 6 depicts wireless connectors that include multiplexer/demultiplexer components.

In some implementations, signals transmitted by the wireless connectors may be multiplexed to compact the data in the transmitted signals. As shown in FIG. 6, the wireless connectors 610, 620 include multiplexer/demultiplexer components 612*a*, 612*b*, 622*a*, 622*b* that multiplex the data stream before the signal is transmitted by a transceivers 611*a*, 611*b*, 621*a*, 621*b*. The signal is demultiplexed by the multiplexer/demultiplexer components 612a, 612b, 622a, 622b after the signal is received by the corresponding transceiver 611a, 611b, 621a, 621b in the wireless connector. Multiplexing allows fewer communication devices to be used resulting in space and cost savings. In some cases, the multiplexer/demultiplexer functionality may be included with wireless communication capability in a single IC chip.

Figure 7:
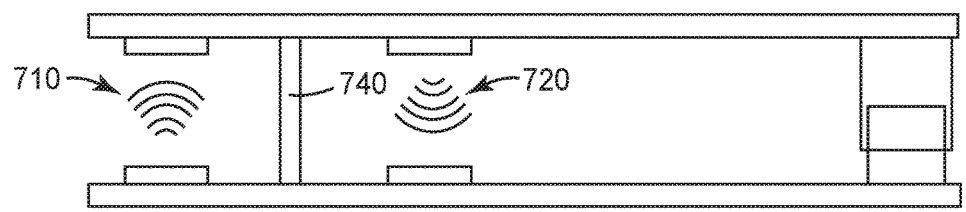
FIGS. 7 and 8 show partitions that separate the communication channels of wireless connectors.

Another approach to reduce crosstalk, involves partitions that may be used between wireless connectors to isolate the communication channel of one wireless connector from the communication channels of adjacent wireless connectors. FIG. 7 shows a partition 740 that separates the communication channels of wireless connectors 710 and 720.

Figure 8:
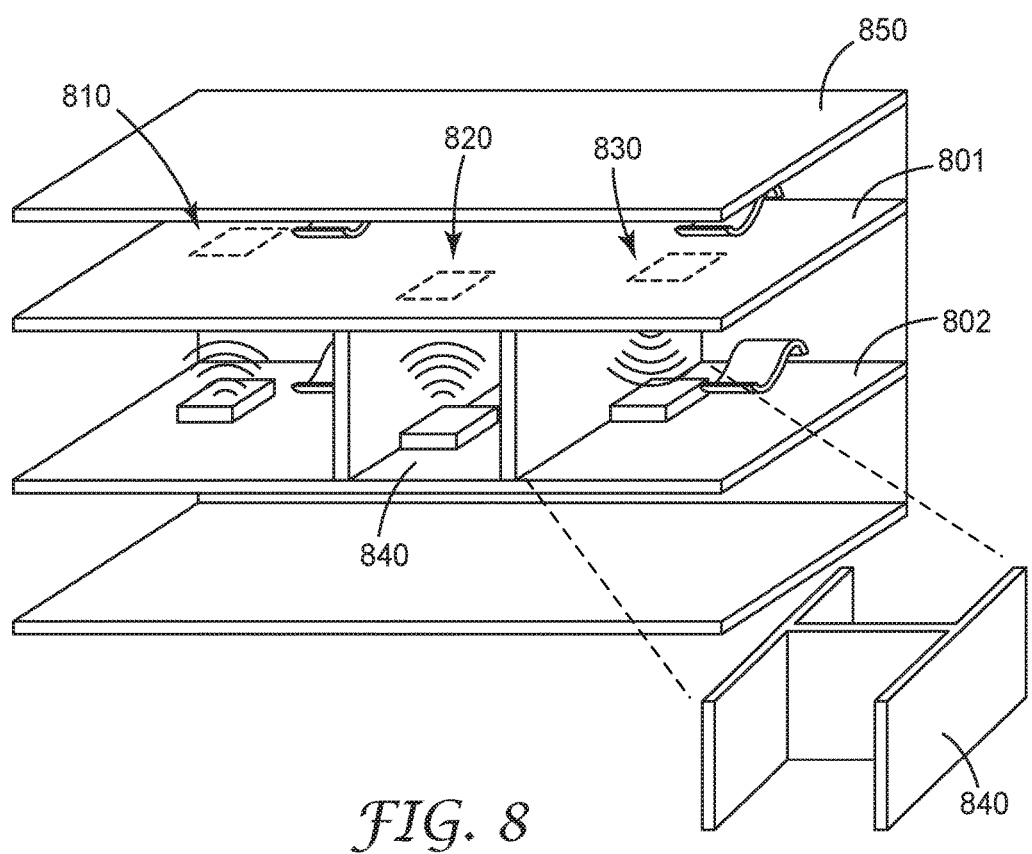

FIG. 8 shows PCBs 801 and 802 disposed within chassis 850. PCBs 801, 802 include wireless connectors 810, 820, 830. A partition 840 can be placed between the wireless connectors 810, 820, 830 to reduce or prevent crosstalk between the wireless connectors. The partition 840 can be fabricated separately and positioned between the PCBs 801, 802 before or after the PCBs 801, 802 are arranged in the chassis 850. The partitions 740, 840 shown in FIGS. 7 and 8 may serve as noise mitigation structures and/or signal enhancement structures.

Figure 9:
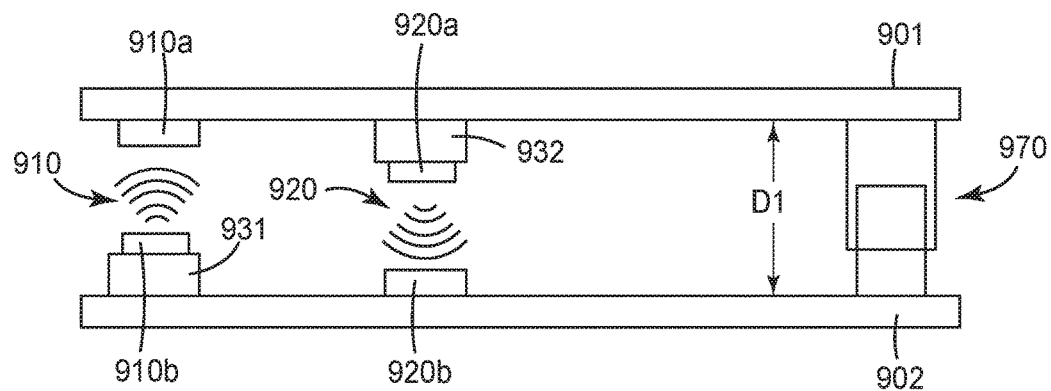
FIGS. 9 and 10 illustrate extenders extending from PCBs that bring communicating chips closer to their associated communicating chips.

In some configurations, e.g., configurations that use a wired electrical connector, the distance between the PCBs may be constrained by the connector height resulting in a suboptimal spacing for the communicating chips of the wireless connectors. In these cases, one or both of the communicating chips in a wireless connector may be mounted on a platform or other structure that brings the communicating chips into a proximity that allows adequate communication signal strength. For example, a platform may extend from the surface of one PCB towards the surface of an adjacent PCB, as shown in FIG. 9. FIG. 9 shows wired electrical connector 970 which constrains the distance, D1, between PCB 901 and PCB 902. The distance, D1, is suboptimal for communication between transmitting chips 910b, 920a and the associated receiving chips 910a, 920b. Extenders 931, 932 bring the communicating chips 910b, 920a closer to their associated chips 910a, 920b.

Figure 10:
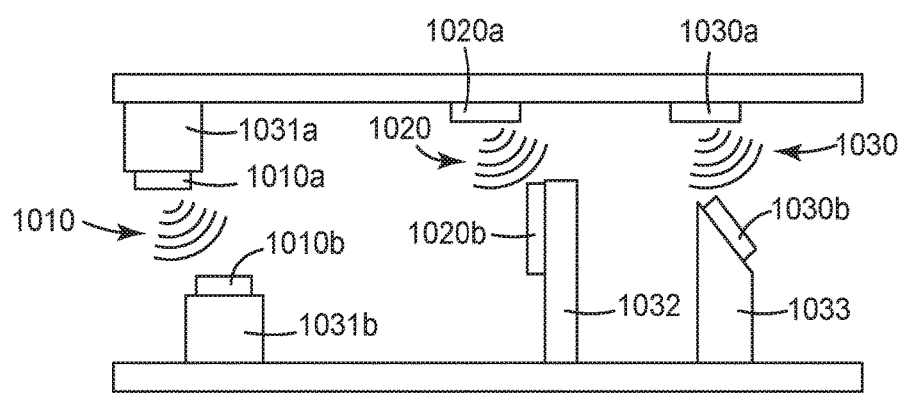

One or both communicating chips and a wireless connector may be disposed on an extender. As illustrated in FIG. 10, one or more extenders 1031a, 1031b may be arranged so that the communicating chips 1010a, 1010b in a wireless connector 1010 are offset from one another on the PCBs; one or more extenders 1032 may be arranged so that the communicating chips 1020a, 1020b in a wireless connector 1020 are disposed at right angles to one another, and/or one or more extenders 1033 may be arranged so that the communicating chips 1030a, 1030b in a wireless connector 1030 are arranged at any suitable angle to one another that achieves acceptable noise mitigation and/or signal strength.

Figure 11:
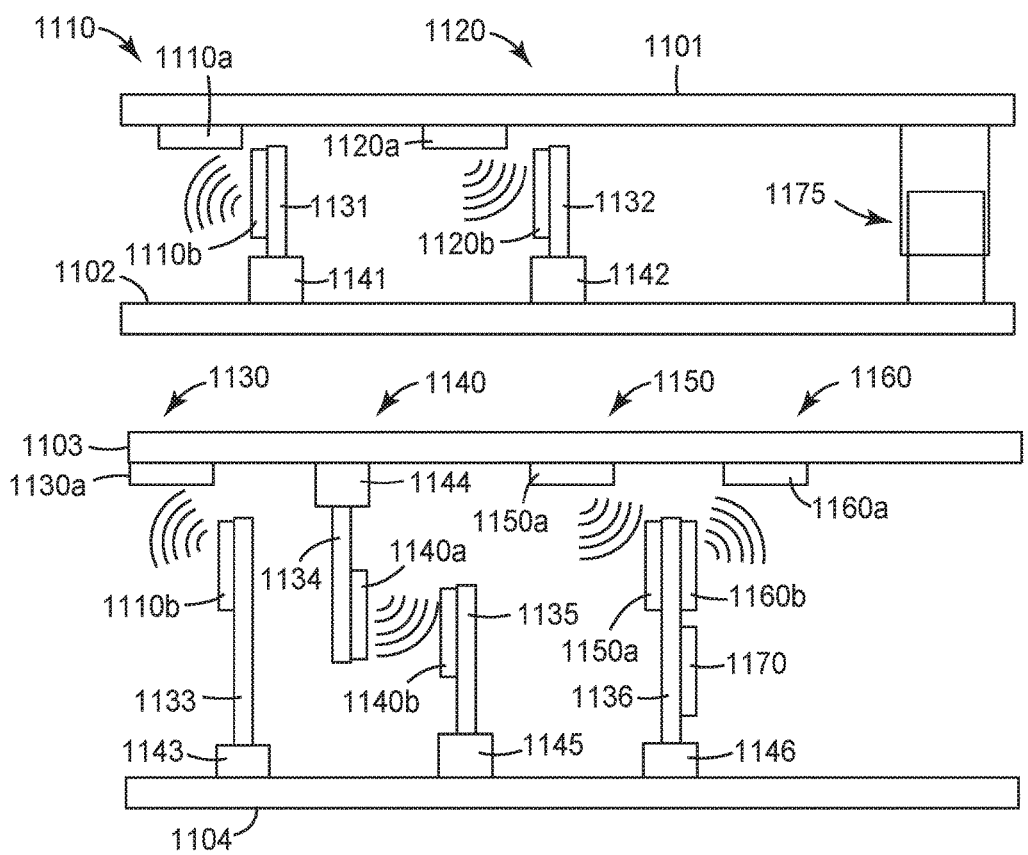
FIG. 11 shows extenders formed using PCBs and wired connectors.

In some configurations, it may be convenient to mount the communicating chips of wireless connectors on PCBs that act as extenders. The PCB extenders can be coupled to main PCBs through a wired connector, e.g. such as an edge card connector. FIG. 11 shows a system that includes four main PCBs 1101, 1102, 1103, and 1104 and six extender PCBs 1131, 1132, 1133, 1134, 1135, 1136. Wireless connectors 1110, 1120 communicate between PCBs 1101 and 1102. The distance between PCBs 1101 and 1102 is constrained by the dimensions of wired electrical connector 1175. The wireless connectors 1110, 1120 include communicating chips 1110a and 1120a which are mounted on PCB 1101, respectively, and which communicate with communicating chips 1110b and 1120b, respectively. Communicating chips 1110b and 1120b are mounted on extender boards 1131 and 1132, respectively. Extender PCBs 1131 and 1132 are electrically connected to main PCB 1102 through edge card connectors 1141 and 1142, respectively.

The system shown in FIG. 11 also includes PCBs 1103 and 1104 which are spaced apart from one another. Wireless connectors 1130, 1140, 1150, 1160 communicate between PCBs 1103 and 1104. In this arrangement, chips 1130a, 1150a and 1160a communicate with chips 1130b, 1140b, and 1150b, respectively. Chip 1130a is mounted directly to main PCB 1103 and communicates with chip 1130b mounted on extender PCB 1133. Extender PCB 1133 is electrically connected to main PCB 1104 through edge card connector 1143. Chips 1140a and 1140b of wireless connector 1140 are mounted on extender PCBs 1134 and 1135, respectively. Extender PCB 1134 is coupled to main PCB 1103 through edge card connector 1144. Extender PCB 1135 is coupled to main PCB 1104 through edge card connector 1145.

Extender PCB 1136 includes two communicating chips 1150b and 1160b. Chip 1150b communicates with chip 1150a which is mounted directly on main PCB 1103. Chip 1160b communicates with chip 1160a which is directly mounted to main PCB 1103. Extender PCB 1136 is coupled to main PCB 1104 through edge card connector 1146. Extender PCB 1136 includes an additional device 1170, which may be a component that generates the digital signal that is used to modulate the carrier signal. In general, any of the extender PCBs may include devices other than the chips included in the wireless connectors. In some scenarios, the extender PCBs may include demultiplexers/multiplexers, other devices that facilitate communication, that are separate from the communicating chips, i.e., transmitters, receivers, transceivers. Any or all of the wired connectors 1141, 1142, 1143, 1144, 1145 and/or 1175 may carry wired signals between any or all of the communicating chips 1110a, 1110b, 1120a, 1120b, 1130a, 1130b, 1140a, 1140b, 1150a, 1150b, 1160a, 1160b. The wired signals may include ground, power, clock, timing/control signals, and or any other signals.

Figure 12:
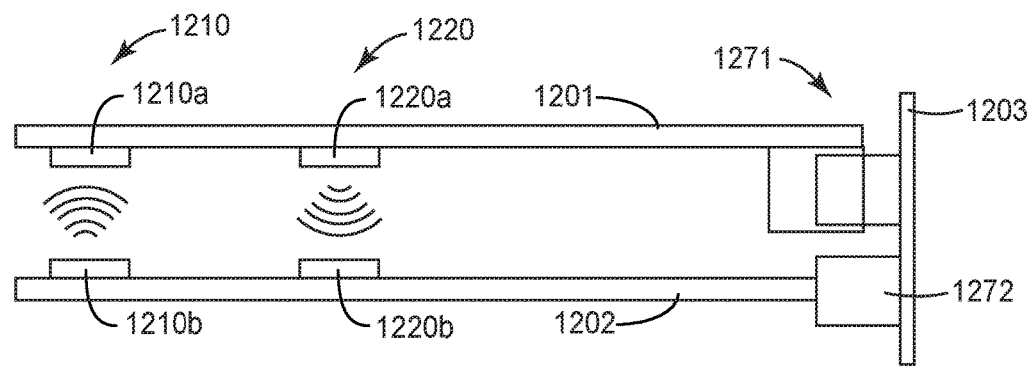
FIGS. 12 and 13 show a configuration for an electronic system that includes one or more point-to-point wireless connectors with communicating chips mounted on PCBs that are electrically coupled to a backplane.

FIG. 12 shows another configuration for a system that includes one or more point-to-point wireless connectors, such as wireless connectors 1210 and 1220. In the configuration of FIG. 12, communicating chips 1210a and 1220a are mounted on PCB 1201. PCB 1201 is electrically coupled to a backplane 1203 through connector 1271 which is a plug and socket type connector. Communicating chips 1210b and 1220b are mounted on PCB 1202 which is electrically coupled to the backplane 1203 through edge card connector 1272. Connector 1271 and/or 1272 may include wiring to provide power, ground, data and/or timing/control signals to communicating chips 1210a, 1220a, 1210b, 1220b as needed by the application. Mechanical positioning by the connectors 1271 and 1272 may provide sufficient spacing and positional accuracy for the PCBs 1201 and 1202 to communicate wirelessly through wireless connectors 1210 and 1220. As previously mentioned, in some cases, the communicating chips 1210a and 1210b of wireless connector 1210 and/or the communicating chips 1220a and 1220b of wireless connector 1220 may share some wired signals in common, such as ground, power, clock signals, and/or channel/timing control signals.

Figure 13:
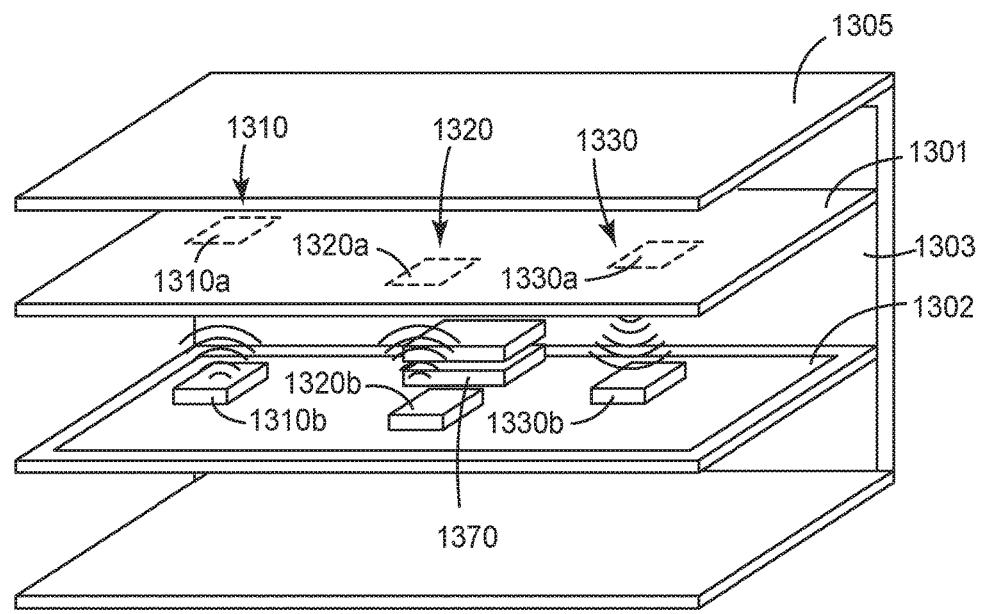

FIG. 13 shows two PCBs 1301, 1302 disposed within a chassis 1305. PCBs 1301 and 1302 include wireless connectors 1310, 1320, 1330. PCB 1301 includes communicating chips 1310a, 1320a, 1330a which communicate wirelessly with communicating chips 1310b, 1320b, 1330b, respectively. PCB 1302 is electrically coupled to backplane PCB 1303 through edge card connector 1370. Similarly, PCB 1301 is electrically coupled to backplane PCB 1303 through an edge card connector (not shown). In some implementations, the edge card connectors can carry wired signals including ground, power, clock and/or timing signals, control signals, and/or other types of signals to the chips of the wireless connectors.

Figure 14A:
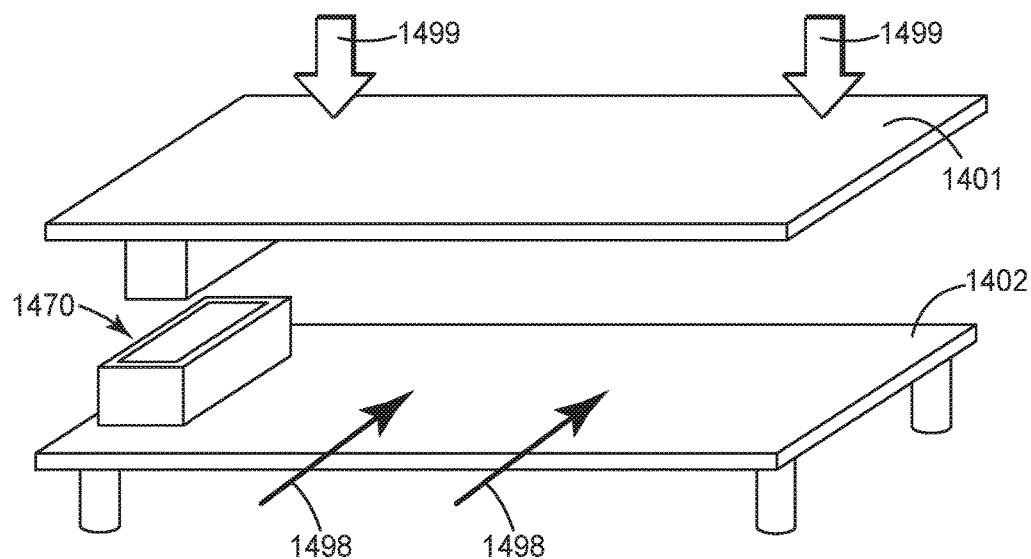
FIGS. 14 A and 14B illustrate the relaxed positional constraints allowed by wireless connectors between PCBs as compared to wired electrical connectors
Figure 14B:
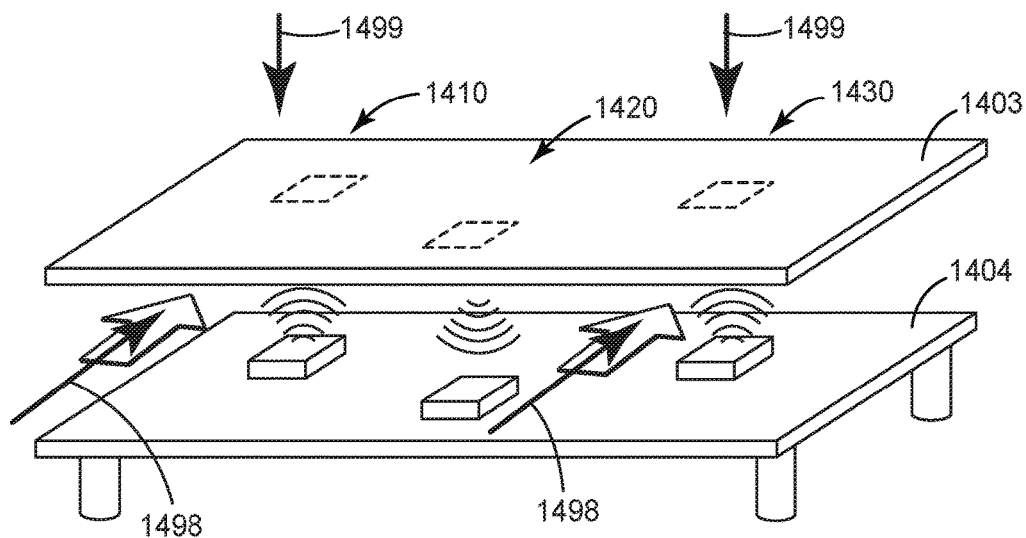

FIGS. 14A and 14B illustrate the relaxed positional constraints allowed by wireless connectors between PCBs as compared to wired electrical connectors. FIG. 14A shows PCBs 1401 and 1402 which are electrically connected through wired connector 1470. Wired electrical connector 1470 has specific tolerance requirements for positioning in the vertical direction 1499 as well as positioning in the horizontal direction 1498. The tolerance requirements of electrical connector 1470 dictate the relative position of PCBs 1401 and 1402.

When wireless connectors are used between PCBs, such as PCB 1403 and PCB 1404 of FIG. 14B, the tolerance requirements can be relaxed as compared to tolerances associated with PCBs connected by wired electrical connectors. FIG. 14B shows three wireless connectors 1410, 1420, 1430 that communicate between PCBs 1403 and 1404. The positional requirements of the wireless connectors 1410, 1420, 1430 involve achieving distances between the communicating chips which provides acceptable signal-to-noise ratio (SNR). Thus, if the PCBs 1403 and 1404 are offset slightly in the horizontal direction 1498 and/or in the vertical direction 1499 this variation may not substantially degrade the SNR of the wireless connectors 1410, 1420, 1430. Also, any variation in the horizontal direction 1498 may be compensated for by a complementary variation in the vertical direction 1499, and vice versa. In other words, as long as the communicating devices of the wireless connectors 1410, 1420 are close enough to communicate reliably with acceptably low SNR, regardless of how that spacing is achieved, then the position of the PCBs 1403, 1404 is acceptable.

Figure 15:
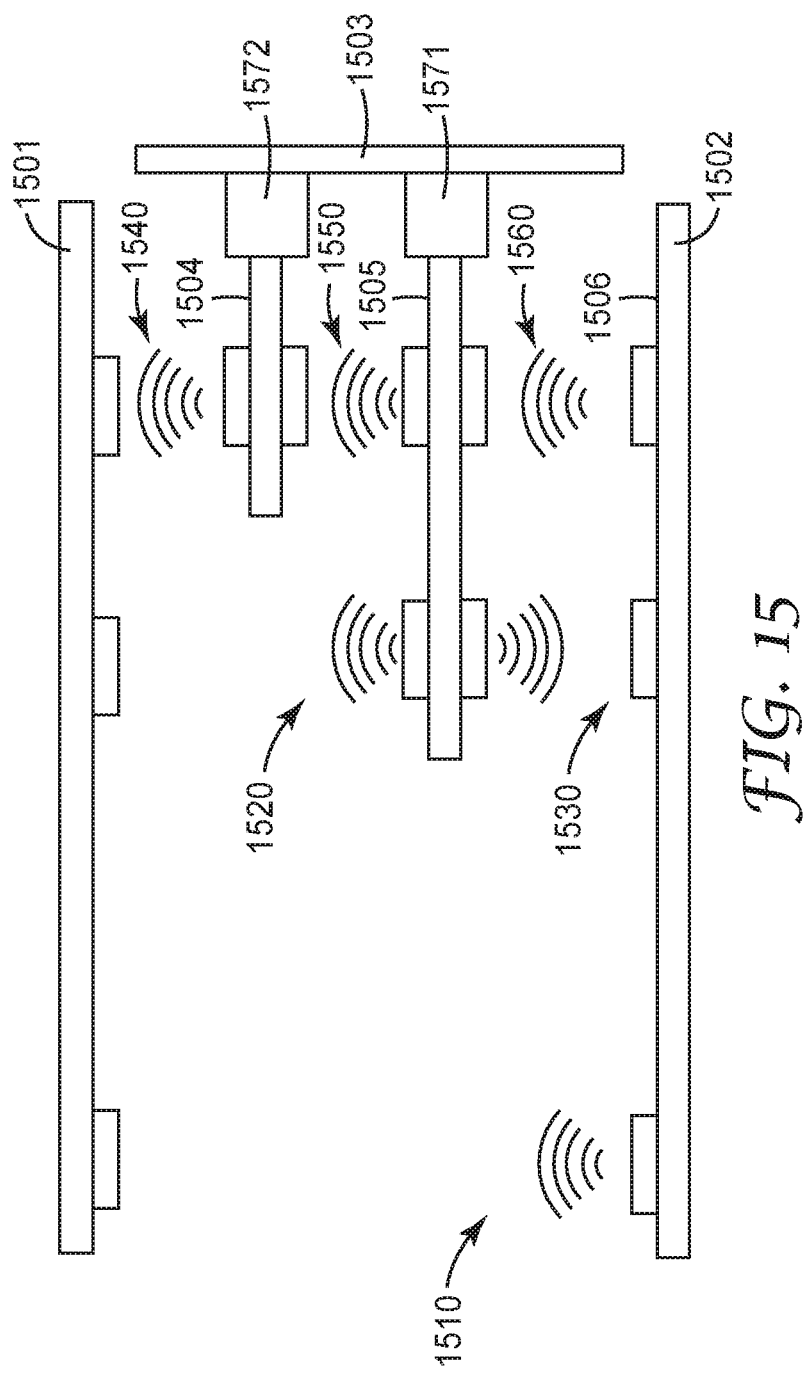
FIG. 15 illustrates a combination of backplane, daughter boards, extender boards wireless connectors and conventional connectors that create a multi-tiered connection scheme.

FIG. 15 illustrates a combination of backplane 1503, daughter boards, 1501, 1502, extender boards 1504, 1505, wireless connectors 1510, 1520, 1530, 1540, 1550, 1560, and conventional connectors 1571, 1572, that create a multi-tiered connection scheme. Extender PCBs 1504 and 1505 are electrically coupled to backplane 1503 through edge card connectors 1571 and 1572. In this example, wireless connector 1510 communicates between daughter PCBs 1501 and 1502; wireless connector 1520 communicates between extender PCB 1505 and daughter PCB 1501; wireless connector 1503 communicates between daughter PCB 1502 and extender PCB 15 wireless connector 1540 communicates between daughter PCB 1501 and extender PCB 1504; wireless connector 1550 communicates between extender PCBs 1504 and 1505; wireless connector 1560 communicates between daughter PCB 1502 and extender PCB 1505.

Figure 16:
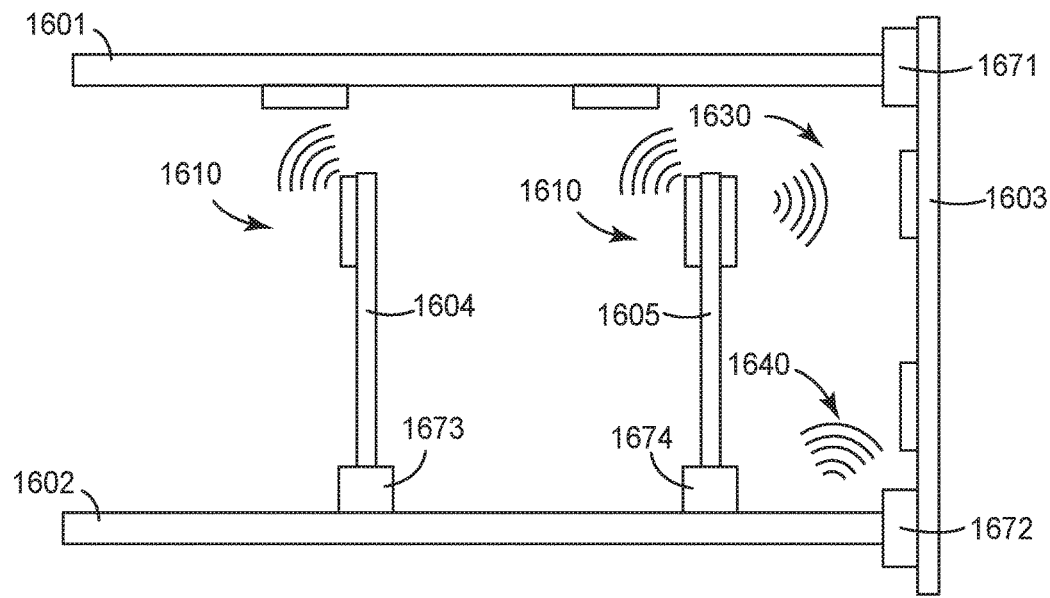
FIG. 16 provides an example of how backplane, daughter boards, and extender boards can be configured within a chassis.

FIG. 16 provides an additional example of how backplane, daughter boards, and extender boards can be configured within a chassis. In FIG. 16, daughter boards 1601 and 1602 are electrically coupled to backplane 1603 through edge card connectors 1671 and 1672, respectively. Daughter PCB 1602 is coupled to extender boards 1604 and 1605 through edge card connectors 1673 and 1674. This implementation includes wireless connector 1610 which communicates between extender board 1604 and daughterboard 1601; wireless connector 1620 which communicates between extender board 1605 and daughterboard 1601; wireless connector 1630 which communicates between extender board 1605 and backplane 1603; and wireless connector 1640 which communicates between daughterboard 1602 and backplane 1603. It will be appreciated that there are many additional configurations which can be used in conjunction with wireless connectors, wired connectors, extender boards, daughter boards, and backplanes, as well as other PCBs within a system.

Figure 17:
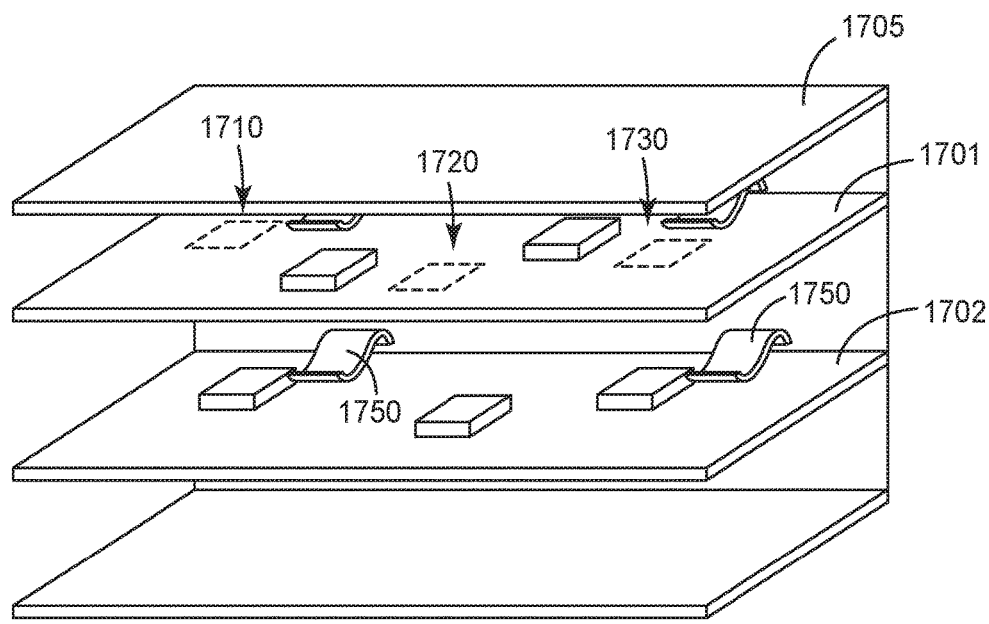
FIG. 17 illustrates a system in which the communicating PCBs do not share wired signals.

In some of the previous examples, PCBs that are wirelessly connected have also been coupled through wired connectors, such as edge card connectors or plug and socket type connectors. In some examples, the communicating chips shared some wired signals such as power, ground, timing, and/or control signals. However, the sharing of wired electrical connections between communicating chips on different PCBs or on the same PCB is not required, and in some implementations it may be desirable to have PCBs that share no wired connections. FIG. 17 illustrates a system in which the communicating PCBs do not share wired signals. The system of FIG. 17 includes a chassis 1705 that at least partially encloses two PCBs 1701 and 1702. PCBs 1701, 1702 are wirelessly coupled through wireless connectors 1710, 1720 and 1730. PCBs 1701 and 1702 are mechanically mounted to the chassis 1705 using brackets 1750. The chassis 1705 and brackets 1750 provide structural support and mechanical positioning for PCBs 1701, 1702 so that the distance between the PCBs 1701, 1702 is compatible with communication through wireless connectors 1710, 1720, and 1730.

Figure 18:
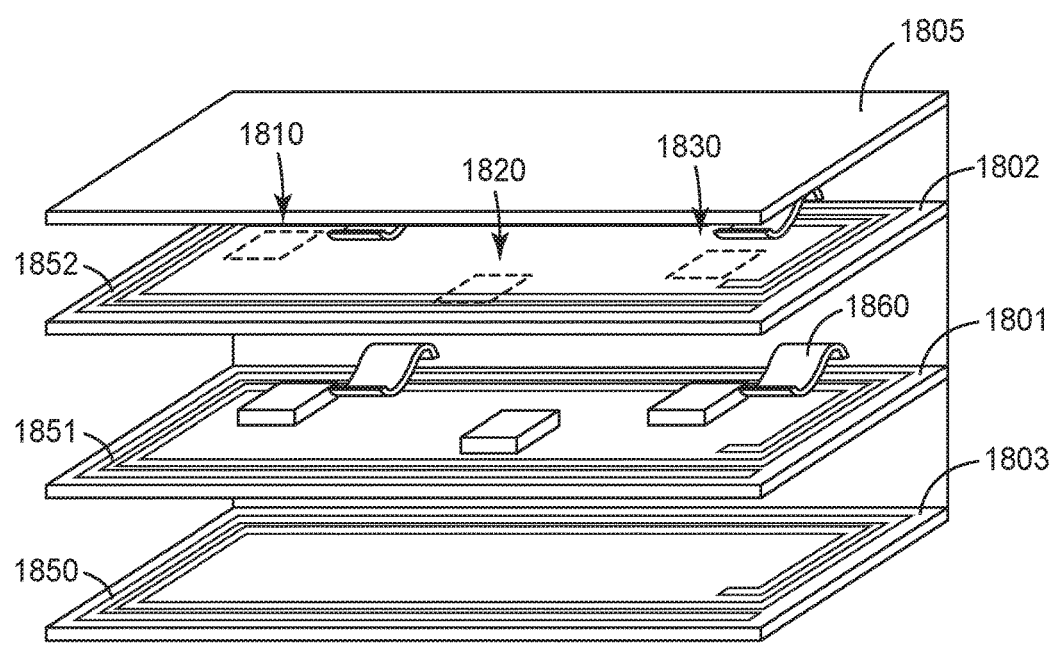
FIG. 18 provides an example of a system in which power is inductively coupled to PCBs through inductive coils.

In some applications, it may be helpful to transfer power and data between PCB without any wired connections between the PCBs. FIG. 18 illustrates a system that includes three PCBs 1801, 1802, 1803 at least partially enclosed within chassis 1805. PCB 1801 and 1802 wirelessly communicate through wireless connectors 1810, 1820 and 1830. Power is inductively coupled to PCBs 1801 and 1802 from PCB 1803 through inductive coils 1850, 1851, 1852. In this configuration, inductive coil 1850 is the only coil in the system that is actively powered. Coil 1850 transfers power to coil 1851 on PCB 1801 and to coil 1852 on PCB 1802 through inductive coupling.

As discussed in some of the examples above, either wireless point-to-point or wireless networked connectors can provide insensitivity to mating depth and alignment, ingress protection e.g. environmental protection typically from dust and or water, mating at any approach angle, zero mating force, and theoretically infinite mating cycles, characteristics which are not generally associated with wired electrical connectors. As discussed above with regard to point-to-point wireless connectors, crosstalk mitigation (which can also be considered noise rejection) from one communication device in the communication pair to another communication device in the communication pair to another needs to be addressed to achieve optimal performance. Examples provided below describe noise mitigation and/or signal enhancement techniques for wireless networked connectors over several size scales and in different applications that can be used to achieve high aggregate bandwidth using a single network or multiple small networks that are either fully or partially isolated or shielded from one another.

A consideration in any wireless application is noise rejection which affects the signal to noise ratio (SNR) of the received signals in the network. Maintaining an acceptable SNR is a factor for both wireless point-to-point and wireless network connectors. In a network, one wireless site can be configured to transmit to another wireless site, but if there is excessive noise, the communication can be error-prone, or if managed with multiplexing, the overhead and latency will reduce the overall bandwidth. Embodiments provided herein illustrate the choice of a suitable structure that attenuates the signal from inside the network from interfering with external communications and also attenuates signals from outside sources (other networks, for example) form interfering with signals on the inside. Such a noise mitigation/signal enhancement structure enables bandwidth re-use from one wireless connector another and increases overall data rate.

Some embodiments described herein use physical structures disposed within a housing to isolate sections of the housing that include small networks from one another so that noise external to any particular network can be attenuated, thereby increasing the bandwidth possible within the enclosed network. Additionally or alternatively, these structures may provide for signal enhancement. In the discussion that follows, the structures that reflect or attenuate interfering signals are referred to as noise mitigation structures and structures configured to retain signals within the network are referred to as signal enhancement structures. Some structures may be configured to operate as both noise mitigation structures and signal enhancement structures. In one example, a structure that reduces interference between adjacent transmitting-receiving pairs, but also guides the wave from one location to another may be used. In some implementations, such a structure may be a plastic shell that includes a conductive material coating one the external surface of the shell so that signals generated within the shell reflected back inside the structure and signals generated outside the structure are reflected away from the structure. A plastic material may be a waveguide, but allows signal to enter or leave the structure.

The physical structures used for noise mitigation/signal enhancement may include, for example, partitions or housings configured to reflect potentially interfering signals generated external to the network away from the network.

The network of a wireless network connector can be substantially physically isolated from other such networks and external noise sources so that communication is optimal within a certain space i.e. the network space. Localization schemes to mitigate noise and/or guide the signal within the network may also involve adjusting data transfer within each network in addition to the use of enclosures, partitions and/or other features. In some cases, a transceiver in one section of the housing can identify signals received from transceivers located in other sections. In some configurations, transceivers in one section may use a different carrier frequency from transceivers in another section.

Employing these techniques, the wireless network connectors can have a dense network of connections, and the connectors can also be placed close to each other. The result is a set of networks with an overall bandwidth that may be greater than could be achieved if all the wireless chips were operating in a point-to-point mode and had to be spaced accordingly to achieve acceptable SNR.

Figure 19A:
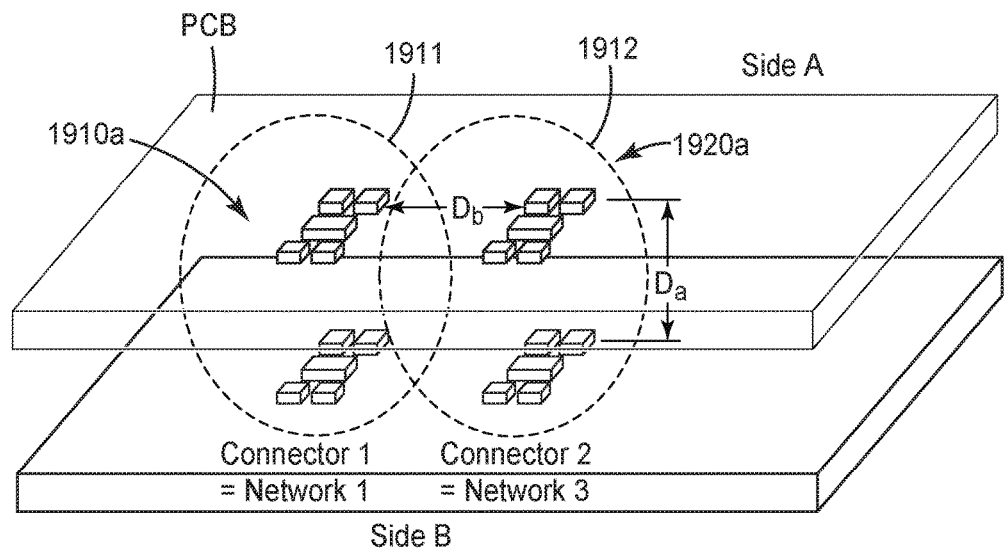
FIG. 19A shows overlapping signals of two wireless connectors.

Noise mitigation may be useful when signals within the network are prone to error because of noise from another communicating device outside the network, or from other sources outside the network. Such a situation can arise when ranges of two networks overlap, as illustrated by the overlapping ranges of networks 1911 and 1912 of wireless network connectors 1910*a* and 1920*a*, respectfully shown in FIG. 19A. Network ranges overlap when the distance, Da, between two halves of a wireless connector are on the same order or farther from each other than the distance, Db, between the wireless connector and a neighboring connector.

Figure 19B:
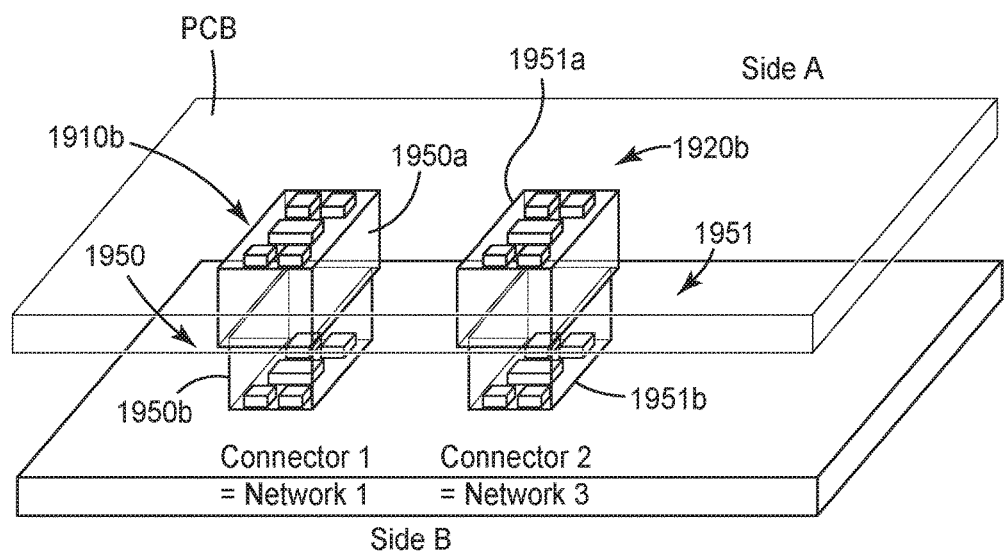
FIG. 19B depicts the wireless connectors of FIG. 19A enclosed in noise mitigation/signal enhancement structures.

As illustrated in FIG. 19B, noise from the neighboring connectors 1910*b*, 1920*b* can be mitigated if the connector chips of one or both of the wireless network connectors 1910*b*, 1920*b* are disposed within enclosures 1950, 1951. The enclosures 1950, 1951 mitigate noise external to the networks they enclose, by reflecting and/or absorbing noise from adjacent connector networks or other sources. The enclosures 1950, 1951 may also substantially retain the network signals within the enclosures 1950, 1951.

Figure 20:
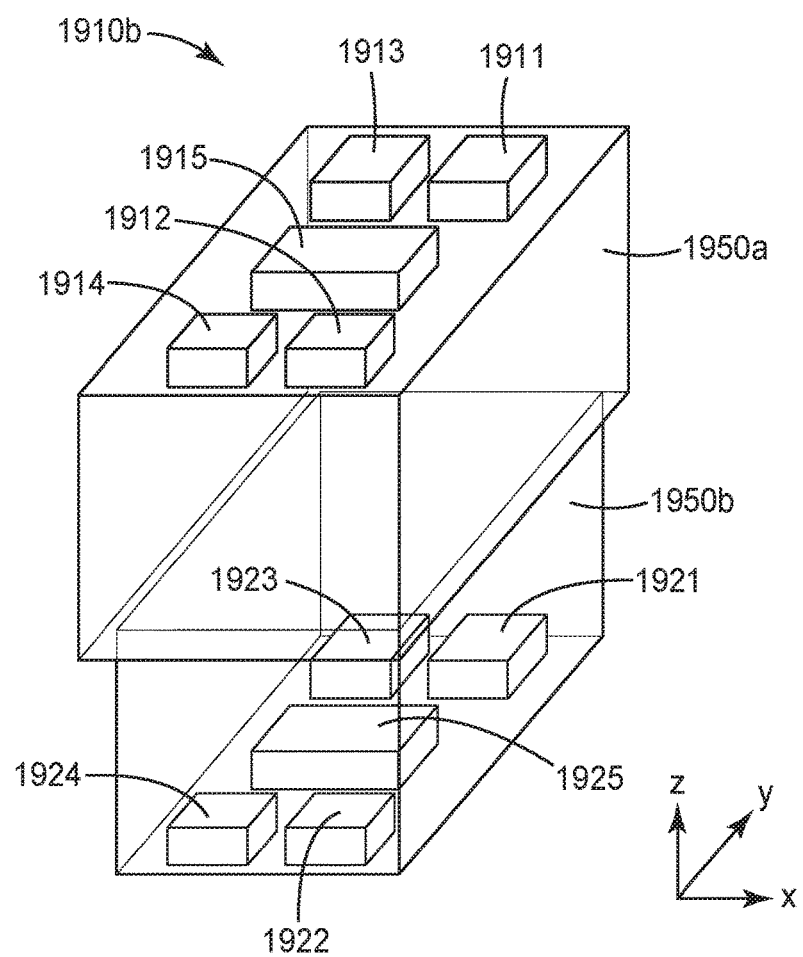
FIG. 20-22D show more detailed views of noise mitigation/signal enhancement enclosures.

FIG. 20 provides a more detailed view of wireless network connector 1910*b* which includes enclosure 1950. Wireless network connector 1910*b* comprises first communication chips 1911-1915 which are disposed on PCB 2001 (see, FIG. 19B) and second communication chips 1921-1925 disposed on PCB 2001 (see, FIG. 19B). The communication chips may comprise, for example, communication chips (e.g., receivers, transmitters, or transceivers) 1911, 1912, 1921, 1922, multiplexers/demultiplexers 1913, 1914, 1923, 1924, and controller chips 1915, 1925. The enclosure 1950 includes mating portions 1950*a* and 1950*b*, and in this example, the walls of mating portion 1950*a* overlap the walls of mating portion 1950*b* so that portion 1950*b* fits partially within portion 1950*a*.

FIGS. 21A-F illustrate additional configurations for wireless network connector enclosures 2115, 2125, 2135 that may provide noise mitigation and/or signal enhancement. FIGS. 21A-F illustrate that noise mitigation/signal enhancement enclosures need not have two halves, and can be formed by a single enclosure shell. Furthermore, the enclosure shell may, but need not, extend the entire distance between communicating PCBs. FIGS. 21A, 21C, 21E and FIGS. 21B, 21D, 21E show plan and cross sectional views, respectively of various network enclosures 2115, 2125, 2135. Network enclosures 2115, 2125, 2135 at least partially enclose the space 2117, 2127, 2137 of the wireless network connectors 2110, 2120, and 2130 that extends between the PCB 2111, 2121, 2131 and PCB 2112, 2122, 2132.

Figures 21A, 21C, 21E:
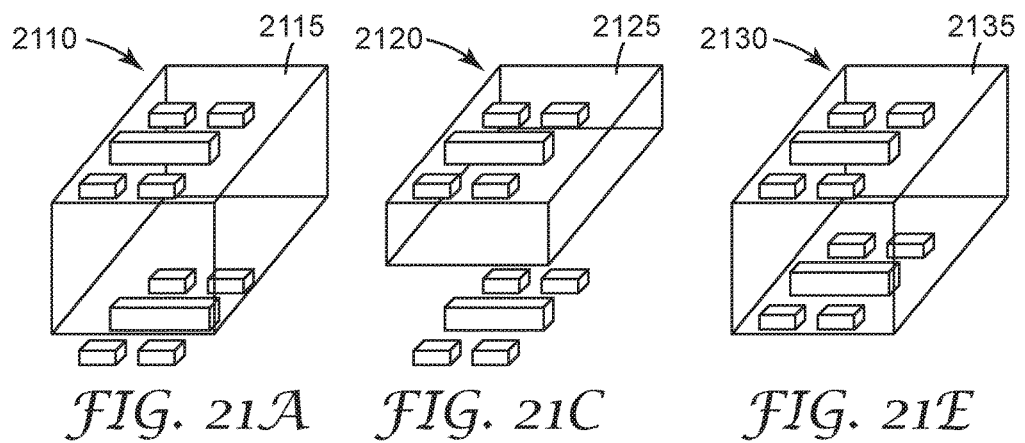
Figures 21B, 21D, 21F:
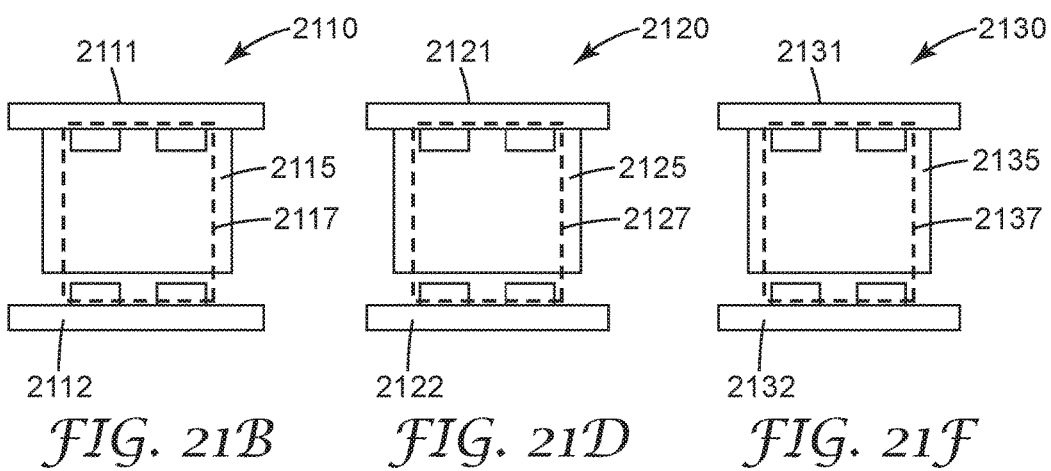

FIGS. 21A and 21B illustrate an enclosure 2115 that extends a majority or more than half of the distance between PCBs 2011 and 2112. Enclosure 2125 illustrated in FIGS. 21C and 21D extends less than half the distance between communicating PCBs 2121 and 2122. Enclosure 2130 extends substantially the entire distance between PCBs 2131 and 2132. In various implementations, each of these arrangements may provide and acceptable amount of noise mitigation and/or signal enhancement.

Figure 22A:
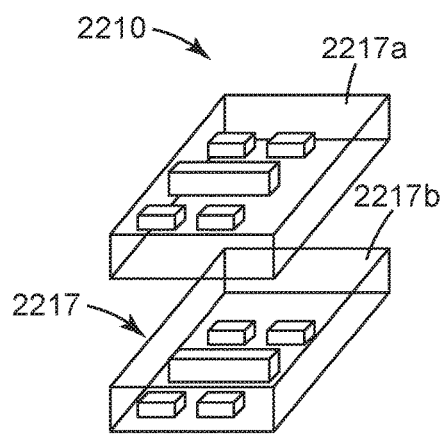
Figure 22C:
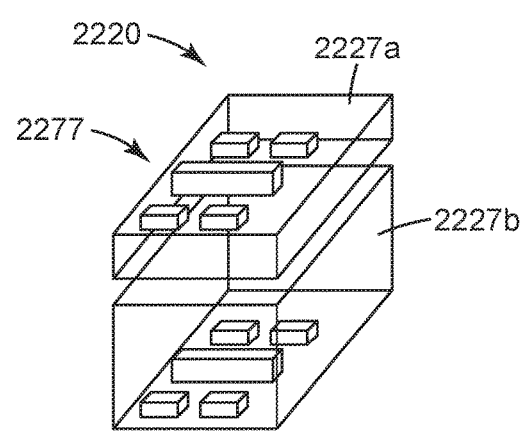
Figure 22B:
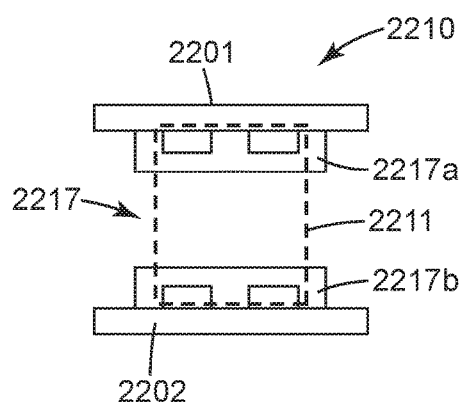

FIGS. 22A-22D illustrate additional enclosure configurations that include upper and lower portions. As illustrated in FIGS. 22A and 22B, wireless network connector 2210 includes enclosure 2217 which partially encloses the connector space 2211 between PCBs 2201, 2202. Enclosure 2217 includes first and second portions 2217*a* and 2217*b*. The enclosure portions 2217*a* and 2217*b* collectively extend less than majority of the distance between PCB 2201 and PCB 2202.

Figure 22D:
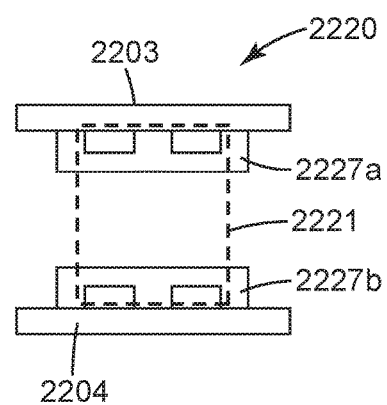

FIGS. 22C and 22D show views of a wireless network connector 2220 that includes enclosure 2227. Enclosure 2227 comprises first and second portions 2227*a* and 2227*b* which collectively extend a majority of the distance between PCBs 2203 and 2204, thus enclosing a majority of the connector space 2221. In various implementations, either of these arrangements of FIGS. 22A, 22B and FIGS. 22C, 22D may provide an acceptable amount of noise mitigation and/or signal enhancement.

The enclosures illustrated in FIGS. 21 and 22 include at least one portion that encloses one set of the wireless communication chips. In the orientations shown in FIGS. 21 and 22, either the enclosure portions enclose the communication chips on the upper PCB, or on the lower PCB or both.

The extent of the enclosure portion used for noise mitigation may be selected to reduce the crosstalk to an acceptable level. The enclosure material may reflect or attenuate signals external to the wireless network connector and/or may reflect signals within the enclosure to enhance the signal strength within the wireless network connector.

In some implementations, a modular wireless connector element may comprise one half of a wireless connector. The modular wireless connector element may include a communication chip, e.g., transmitter, receiver, transceiver, which can be disposed on a modular PCB, along with some means for connecting the PCB of the modular wireless connector element to another PCB. For example, the attachment mechanism may include one or more of solder balls, surface mount leads, edge tabs, press fit pins, and/or other such connector and may also include a noise mitigation/signal enhancement structure already attached, e.g., a partition of enclosure. The modular wireless connector element described above provides one half of the wireless connector and the other half of the wireless connector may be a wireless chip, or may be a modular wireless connector element similar to the one described above.

Figure 23:
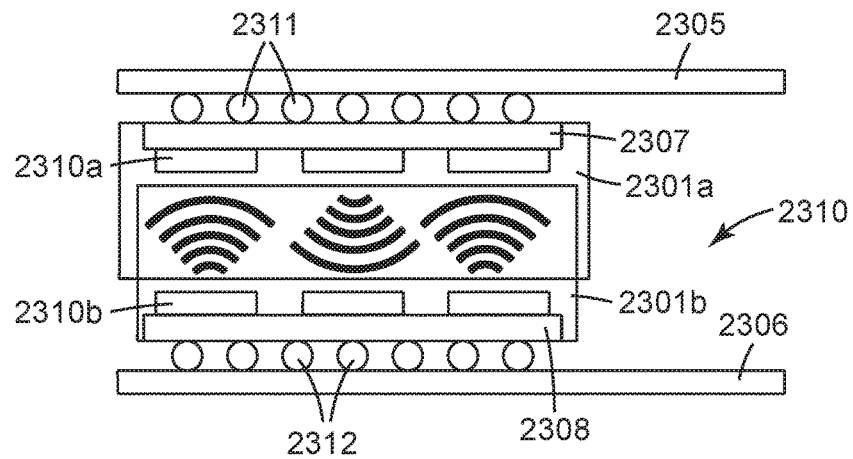
FIG. 23 shows a wireless connector comprising two modular wireless connector elements.

As illustrated in FIG. 23 a wireless network connector 2310 includes modular wireless connector elements 2310a, 2310b. A first modular wireless connector element 2310a of wireless connector 2310 includes one or more communication chips disposed on a PCB 2307 and optionally also includes a noise mitigation/signal enhancement enclosure 2301a. A second modular wireless connector element 2310b of wireless connector 2310 includes one or more chips disposed on PCB 2308 and optionally also includes a noise mitigation/signal enhancement enclosure 2301b. The wireless network connector elements 2310a, 2310b may also include some means to connect their respective PCBs 2307, 2308 to one or more main boards 2305, 2306, e.g. such as solder balls 2311. After placement on the main PCBs 2305, 2306, the modular wireless connector elements 2310a, 2310b provide wireless connectivity between the main PCBs 2305, 2305.

Figure 24A:
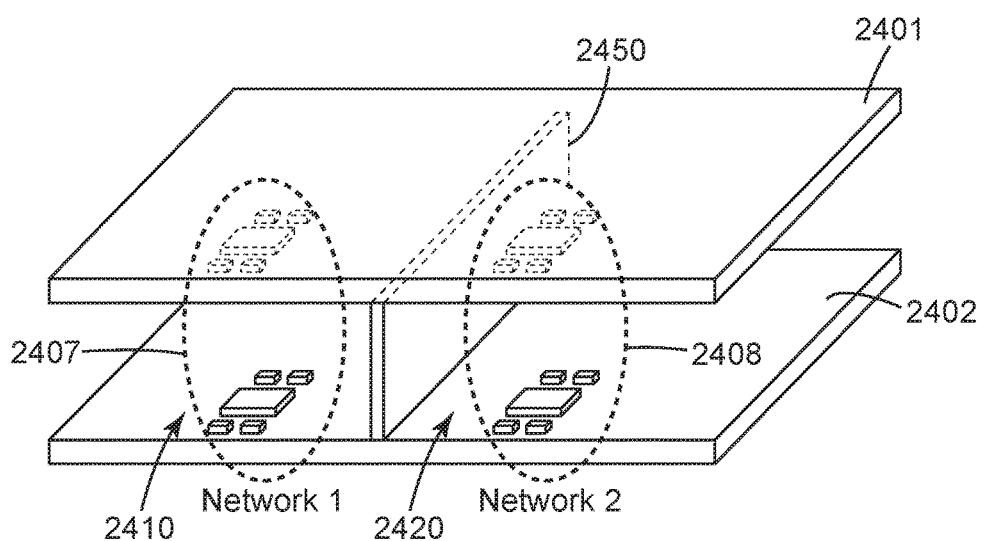
FIGS. 24A and 24B and 25A and 25B show noise mitigation/signals enhancement partitions disposed between PBCs which separate the wireless connectors into sections within the chassis.
Figure 24B:
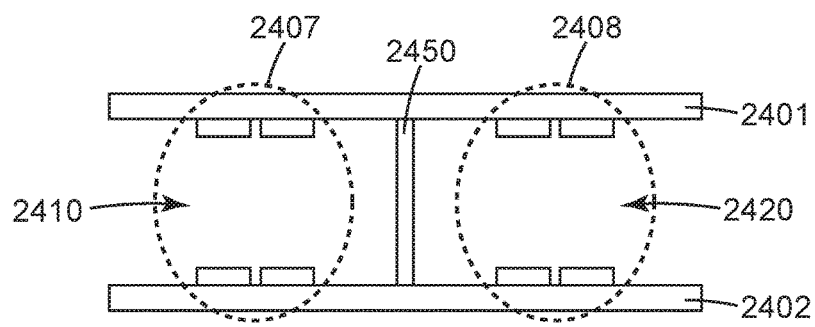

FIGS. 24 and 25 illustrate that in some configurations a partition or frame between or around the wireless network connectors may be used instead of, or in addition to, the enclosures as previously described. Partitions or frames can require fewer individual parts, which may be useful in some arrangements. FIGS. 24A and 24B show plan and cross-sectional views, respectively, of wireless network connectors 2410, 2420 which provide wireless communication between PCB's 2401 and 2402. Wireless network connector 2410 operates in network 2407 which is substantially isolated by partition 2450 from network 2408 of wireless network connector 2420.

Figure 25A:
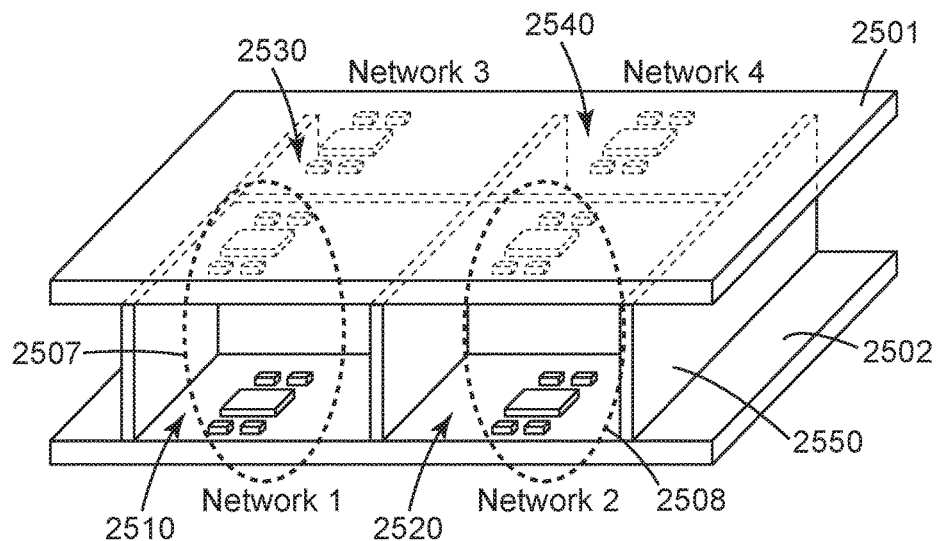
Figure 25B:
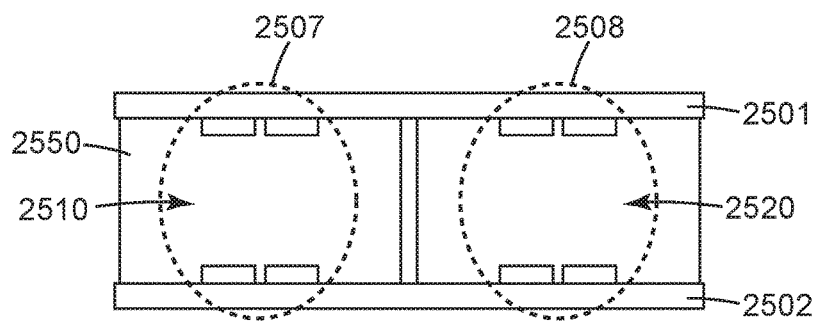

FIGS. 25A and 25B show plan and cross-sectional views, respectively of wireless network connectors 2510, 2520, 2530, 2540 which provide wireless communication between PCBs 2501 and 2502. As illustrated in FIG. 25B, wireless network connector 2510 operates in network 2507, and wireless network connector 2520 operates in network 2508. The wireless networks 2507 and 2508 are isolated from each other by the three-dimensional isolation partition 2550 which also isolates them from the networks of wireless network connectors 2530 and 2540. The two-dimensional or three-dimensional partitions can be used to attenuate the signal from one wireless network connector that encroaches on the network of another wireless network connector. Additionally or alternatively, the material of the partitions may be chosen to reflect or attenuate the signal within the enclosure to contain a sufficient amount of signal strength within the network space. The partitions can be a one-piece structure that can be positioned before or after the PCBs are brought together.

The materials used for the partition or housing are those that can effectively attenuate or shield the signal. The material of the housing can be rigid or flexible and/or can be homogeneous or may comprise a composite material, such as a loaded polymer. An example is a conductive material, an absorbing material, or a polymeric shell that is loaded with conductive or absorbing materials. In some cases, the polymeric material itself can be conductive or absorptive enough to limit the field size. Examples are cast metallic housings, metal foils, metal or carbon loaded polyamide, polybutylene terephthalate (PBT), polycyclohexylene dimethylene terephthalate (PCT), polyester, liquid crystal polymer, polyolefins, etc epoxy, polurethance etc. These plastics can be used unfilled possibly, but can be loaded with absorbing materials such as carbon, glass, other ceramics, metal, etc. In some cases, the material of the noise mitigation/signal enhancement structures can include materials having two or more properties, e.g., two dielectric constants. One of the materials may be more suitable for noise mitigation (keeping signals out generated by sources outside of the wireless connector outside the connector space) and another material may be more suitable for signal enhancement (keeping signals generated by the communicating chips of the wireless connector within the connector space). For example, one material used in a noise mitigation/signal enhancement stricture may comprise a low loss, high dielectric constant to act as waveguide for the signal within the wireless connector space. A second material may be a high loss material, a low loss material with low dielectric constant or even a conductor to help isolate the channels.

Noise mitigation can be aided by limiting the wireless field size and shape by modifying power, antenna size, antenna shape, etc. For low power applications, a polymer shell may be an effective signal attenuator that can limit the network range. An enclosure used for this type of low power connector can differ substantially from an enclosure used in higher power connectors. For example, for low power connectors a suitable enclosure may form a partial or complete shell around the wireless network, however, the enclosure need not provide alignment the two halves of the wireless connector, although it can be used for alignment. Additionally, an enclosure for low power applications may not be supplied in two mating halves, as illustrated in some of the diagrams above. When only a single shell or two partial portions are used, dimensional tolerance requirements for the connector portions and also the tolerances for positioning on the boards is relaxed.

If the network is isolated from external signals by the housing, which also attenuates the signals from its interior from escaping as noise on other nearby networks, the networking software such as code division multiplexing (CDM), time division multiplexing (TDM), orthogonal frequency division multiplexing (OFDM), etc. can be used to reduce the crosstalk to acceptable levels within the network space itself, even though the wireless sites are generally going to be "visible" to one another. In general, any algorithm that provides enough signal isolation (error reduction) while providing acceptable bandwidth can be used. In some cases, wireless network connectors may use several mated "pairs" of wireless sites (transmit and receive) that talk to one another only, but it is also possible that other schemes that transmit data from one site to more than one other site could be used. In general, wireless network connectors involve networks formed within a desired space and data transfer is controlled to obtain acceptable error rates.

Figure 26:
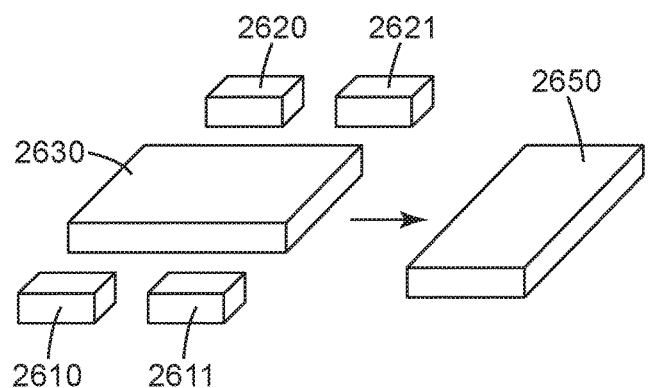
FIG. 26 is a diagram illustrating that the transceiver and various support chips for the wireless connector can be disposed in a single integrated circuit.

The electronics for a wireless network connector can be provided on multiple chips or may be provided in a single chip. FIG. 26 diagrammatically illustrates that a number of specialized chips, such as wireless communication chips 2610, 2620 (e.g., transmitters, receivers, or transceivers), multiplexer/demultiplexer chips 2611, 2621, and controller chip 2630 can be implemented separately, or may be integrated into a single chip 2650.

As discussed above, software can be used to help reduce crosstalk (reduce noise) within the network, and physical structures can also be used to partition the spaces within the chassis itself. These techniques can enhance the isolation within the network and can increase the overall bandwidth capability. In some cases, rather than partition the space within the chassis or housing, it may be helpful to use signal enhancement structures within the chassis that can cause the signal to travel along the structures to a designated location, such as the target receive chip. In a sense, the signal enhancement features can be thought of as waveguides for the transmitted signal. The signal enhancement structures can be solid or hollow structures and can be made of the same material as the chassis or can be inserts made of a material different from the chassis. It may be only necessary to block direct line-of-sight transmission from one transmitter to an unintended receiver and so partial walls could be all that is needed for effective noise reduction.

Figure 27A:
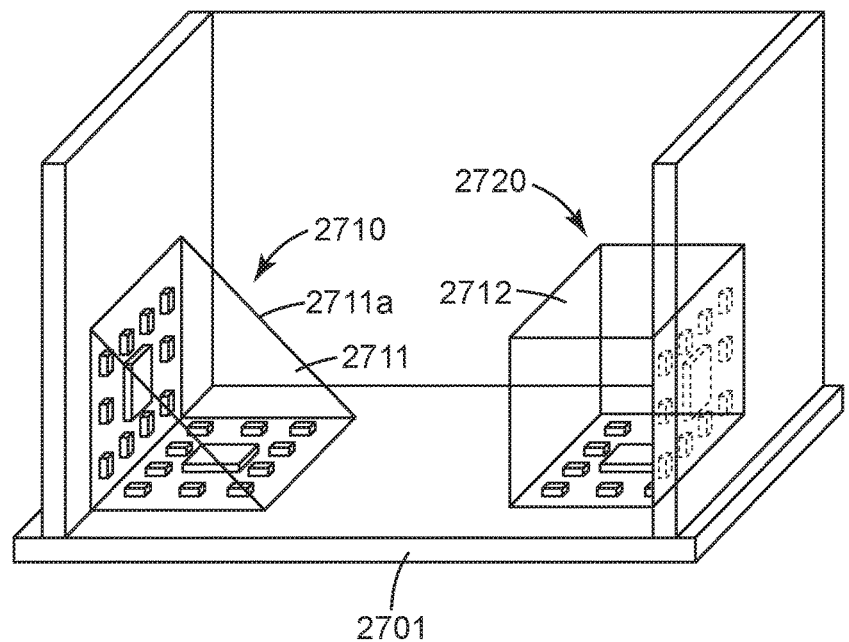
FIGS. 27A and 27B show various types of noise mitigation/signal enhancement structures.
Figure 27B:
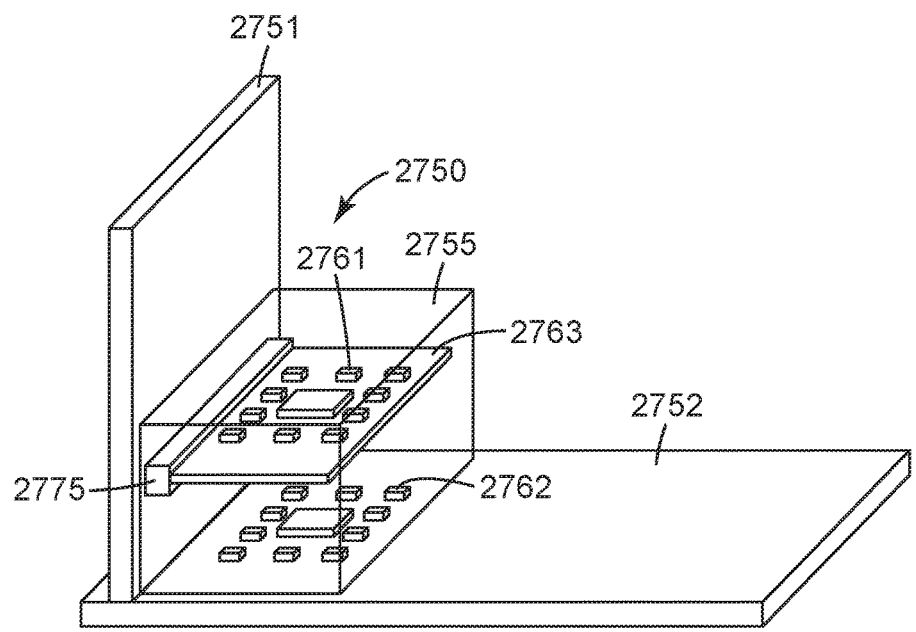

Examples of noise mitigation/signal enhancement enclosures disposed within a chassis that may serve to increase the overall bandwidth capability are shown in FIGS. 27A and 27B. FIG. 27A depicts wireless network connector 2710 which includes enclosure 2711, and wireless network connector 2720 which includes enclosure 2712. Enclosure 2711 includes angled wall 2711a, whereas enclosure 2712 is a box-like structure. The angled wall 2711a of enclosure 2711 may serve to reflect the signal from the transmitter device to the receiver device since the wall 2711a is that an angle of 45 degrees with respect to the direction of transmission of the transmitters. This functionality would be enhanced by a reflective interface at the surface of wall 2711a. The reflectivity of the signal may be achieved by a polymer-air interface, a metal polymer interface, metal air interface, or other interfaces that provide the desired amount of reflectivity of the transmitted signal. As is also shown in FIGS. 27A and 27B, right angle waveguides or box-shaped partitions, such as enclosure 2712 (FIG. 27A) and/or enclosure 2755 (FIG. 27B, can be used to attenuate interfering signals and/or direct the signal to the intended target.

FIG. 27B illustrates a configuration for a wireless network connector 2750. The system shown in FIG. 27B includes PCBs 2751, 2752 that are disposed at right angles to one another. Wireless network connector 2750 includes communication chips 2761 disposed on extender PCB 2753 that communicate with communication chips 2762 disposed on PCB 2752 in this example. Note that chips on extender PCB 2753 face the chips disposed on PCB 2752. Extender PCB 2753 is connected to PCB 2751 by edge card connector 2775. The wireless connector 2750 includes enclosure 2755 which encloses extender PCB 2753, edge card connector 2775, and portions of PCBs 2751 and 2752.

Figure 28:
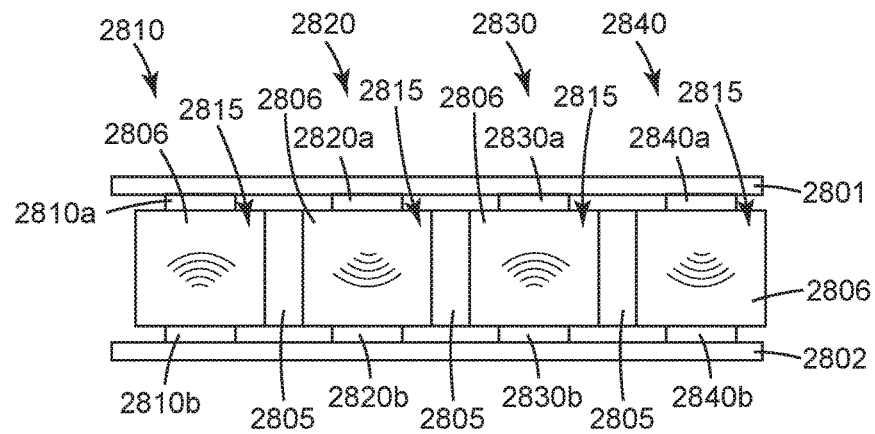
FIG. 28 illustrates the arrangement of various materials that may be used for noise mitigation/signal enhancement.

FIG. 28 is a diagram that illustrates how different types of materials may be used to form a noise mitigation/signal enhancement structure. FIG. 28 shows wireless connectors 2810, 2820, 2830, and 2840, communicatively coupling PCBs 2801 and 2802. Transceivers 2810a, 2820a, 2830a, and 2840a are disposed on PCB 2801. Transceivers 2810a, 2820a, 2830a, and 2840a communicate with corresponding transceivers 2810b, 2820b, 2830b, and 2840b which are disposed on PCB 2802. The region between the two PCBs 2801 and 2802 is divided into sections 2815 by a first material 2805 such that material 2805 is disposed between wireless connectors. A second material 2806 is disposed within the sections 2815 between transceivers 2810a, 2820a, 2830a, 2840a and their corresponding transceivers 2810b, 2820b, 2830b, 2840b. Various types of materials may be used for the first material 2805 and the second material 2806 to achieve noise mitigation/signal enhancement. For example, in some embodiments, the first material 2805 may be a relatively higher loss material and the second material 2806 may be a relatively lower loss material. In another example, the first material 2805 may be a relatively lower permittivity and lower loss material and the second material 2806 may be a relatively higher permittivity and higher loss material. In another example the first material 2805 may be a conductive material, e.g. structured as a conductive wall, and the second material 2806 may be a dielectric material. In another example, the first material 2805 may be air, and the second material 2806 may be a relatively high permittivity, relatively low loss material. In yet another example, the first material 2805 may be a conductive material e.g., structured as a conductive wall, and the second material 2806 may be air. In the case of a low loss material, the loss tangent of such a material is generally less than 0.1. Teflon, Duroid and many other dielectric and ceramic materials can be employed for such configurations. In the case, when a high loss material is chosen, the loss tangent of such a material is generally greater than 0.1. One example of such materials may be carbon loaded polymer composites but a large number of materials can fall into such category. For example, the relative permittivity of air is 1.0 and the relative permittivity of alumina is 9.9 and the relative permittivity of a glass reinforced epoxy such as FR4 is 4.6. The loss tangent of air is 0, the loss tangent of alumina 0.0003 and the loss tangent of a glass reinforced epoxy such as FR4 is 0.017.

In some cases the PCBs upon which the communication chips are mounted may be used as a noise mitigation structure element. Printed circuit boards generally comprise dielectric materials and the thickness of the PCB by itself can be an effective attenuator or shield of the signal. In addition, PCBs include a significant amount of conductor material either in the traces of the PCB and/or in ground and power planes. These conductors can provide a signal attenuator. Other boundaries of the network can be defined by additional PCBs, the outer shell of the chassis, a chassis liner such as metal foil, loaded polymer, absorber, or any other material that can attenuate the signal.

Figure 29:
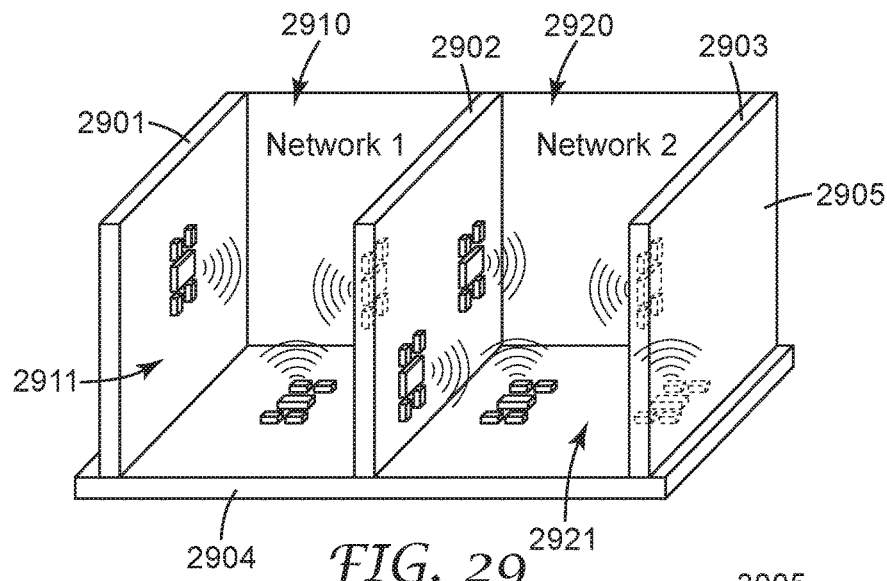
FIGS. 29 and 30 are diagrams that illustrate the use of PCBs and chassis for noise mitigation between neighboring wireless connectors.

FIG. 29 illustrates four PCBs 2901, 2902, 2903, 2904 at least partially enclosed within a chassis 2905. Within the chassis, wireless network connector 2910 provides communication between PCBs 2901, 2902 and 2904 and wireless network connector 2920 provides communication between PCBs 2902, 2903, and 2904. PCBs 2901, 2902, and 2903 are oriented at right angles to PCB 2904 and each of the PCBs in conjunction with the chassis 2905 may provide a noise mitigation structure that serves to substantially contain the signals of each wireless network connector within a space 2911, 2921 between the PCBs and the chassis.

In the arrangement of FIG. 29, the signals of wireless network connector 2910 may be substantially contained in the network space 2911 between PCBs 2901, 2902, 2904 and chassis 2905. The signals of wireless network connector 2920 may be substantially contained in the network space 2921 between PCBs 2902, 2903, 2904 and chassis 2905.

Figure 30:
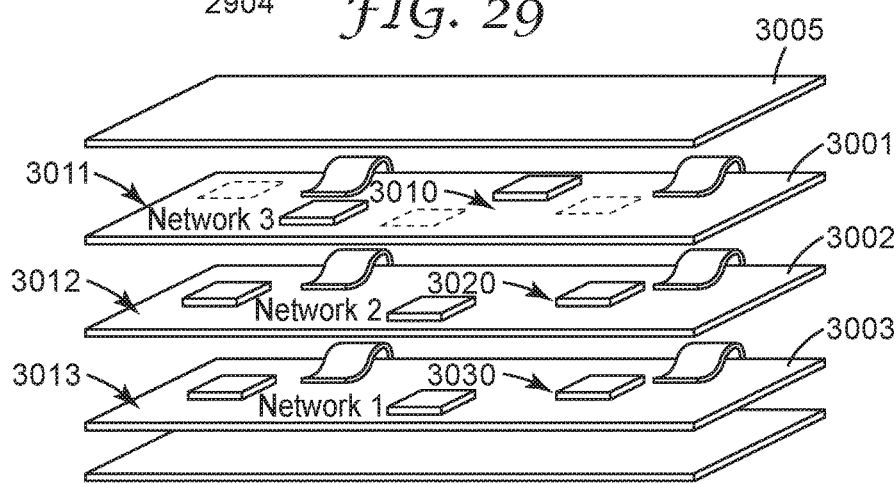

FIG. 30 shows an implementation of wireless network connectors 3010, 3020, 3030 that communicate between PCBs 3001 and 3002 and between PCBs 3002 and 3003. As previously mentioned above, the material layers of the PCBs 3001, 3002, 3003 may provide noise mitigation between networks 3010, 3020, 3030 and confine the signals of the networks 3010, 3020, 3030 in the network spaces 3011, 3012, 3012 between the PCBs 3001, 3002, 3003.

Figure 31:
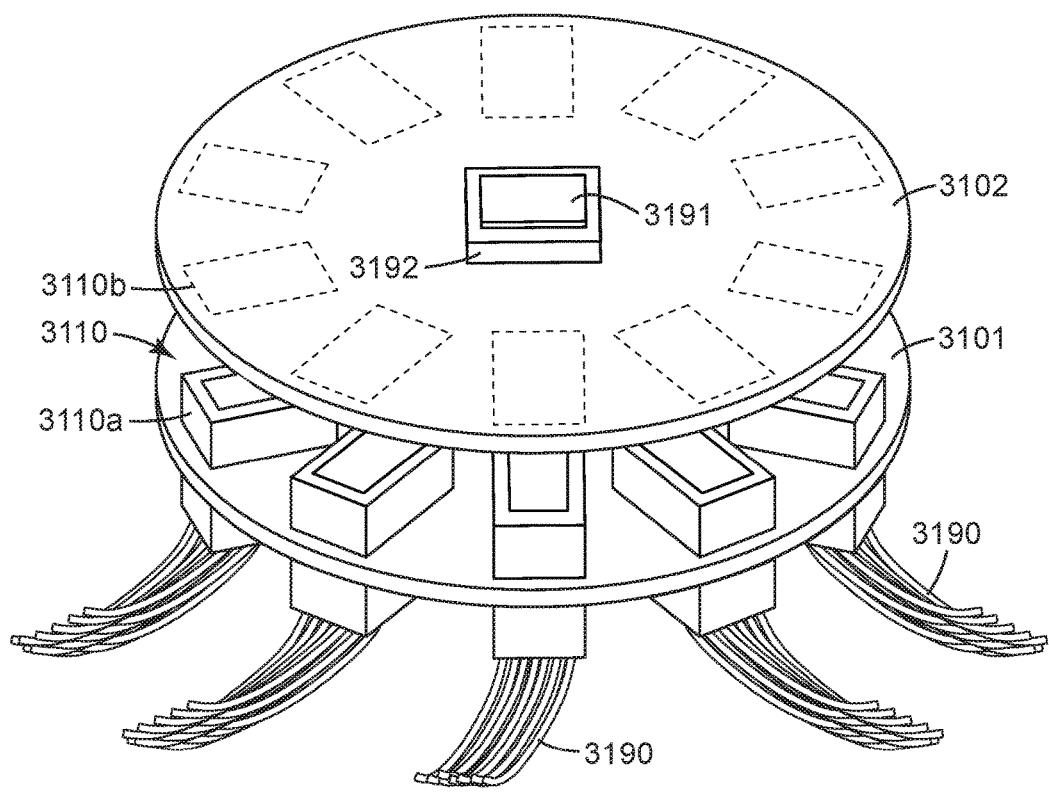
FIGS. 31-33 illustrate the use of wireless network connectors as part of an automated tester.
Figure 32:
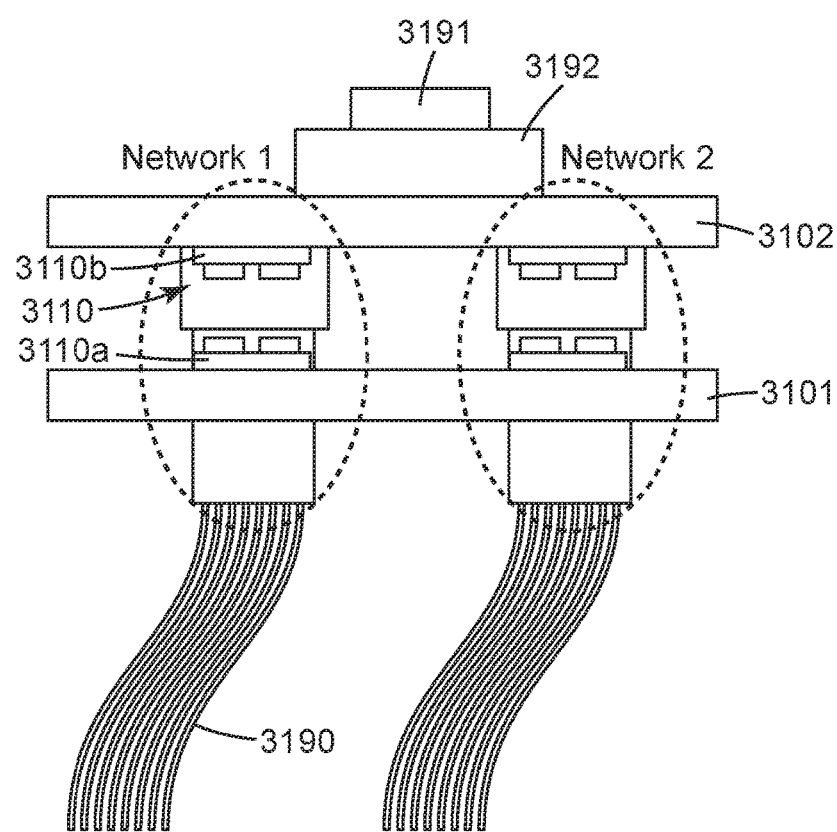
Figure 33:
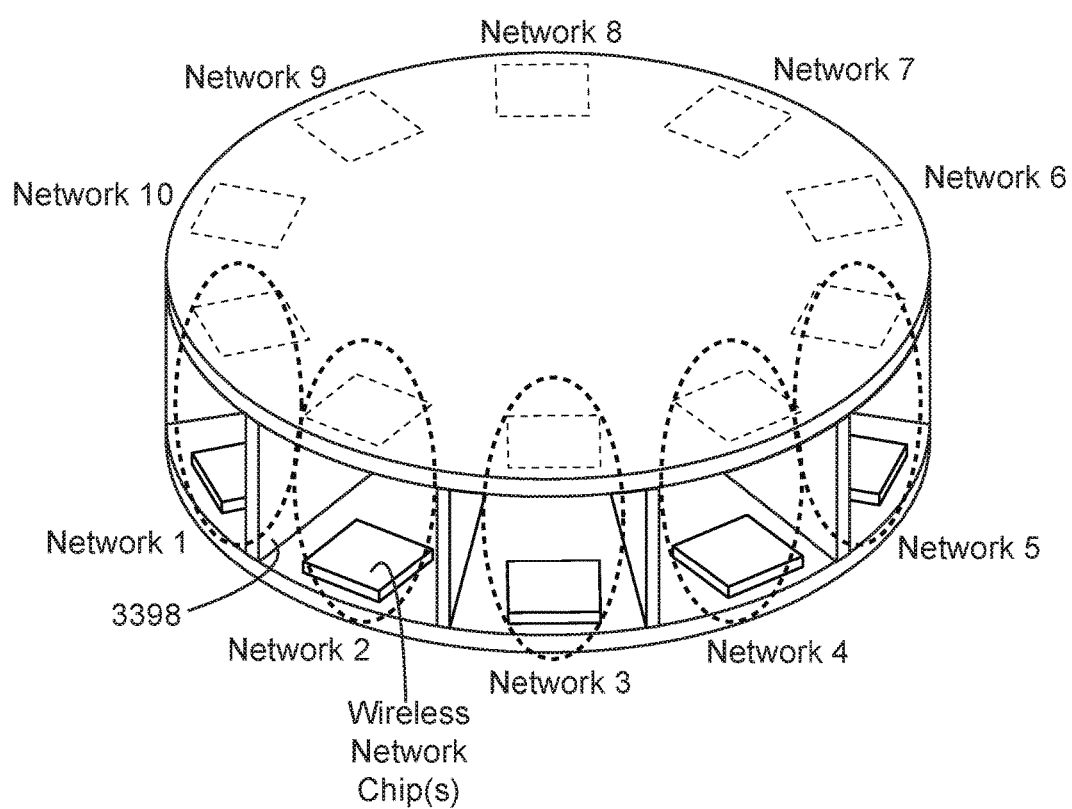

An application using a series of wireless network connectors are depicted in FIGS. 31 and 32 as part of an automated tester that is used to measure chip performance, the device under test (DUT) mounted in a socket. Typically, this is accomplished using pogo pins style connectors between a first board 3101 and the second 3102 where the pins carry the signal and are compressed to make contact across the board. The pogo pins can be unreliable, have limited lifespans and are costly. As shown in FIG. 31, in the place of pogo pins, a set of wireless network connectors 3110 can be used. The cable assemblies 3190 are tied to the test apparatus (not shown) at one end and then to the first portion of the wireless connector 3110a on the other end. The second portion of the wireless connectors 3110 are under the second board 3102 facing the first portion of the wireless connectors 3110. These connectors can include enclosures, as illustrated, for example in FIG. 20, or can be configured with partitions 3398 as in FIG. 33.

The second board 3102 may be a PCB and the first board may also be a PCB. The cables 3190 can make connection on the top or bottom side of the board 3101, and then the board 3101 routes the signal to the wireless network chips in the first portions 3110a of the wireless network connectors 3110. The signal is transmitted wirelessly across the gap between boards 3101, 3102 and into the second board 3102.

Figure 34:
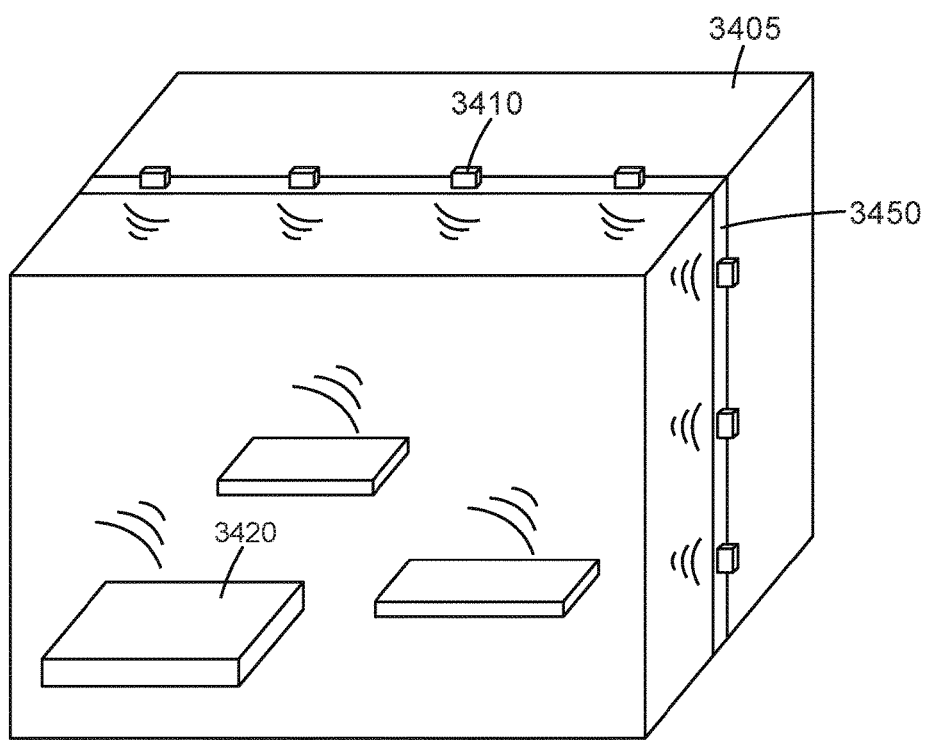
FIG. 34 depicts an electronic system comprising a cable that includes radiation points.

In some implementations, as illustrated in FIG. 34, a structure for wirelessly connecting printed circuit boards and devices within an electronic system involves the use of an electrical or an optical cable 3450 which acts as a backbone for providing wireless coverage throughout the system. The cable 3450 includes radiation points 3410 on the cable 3450.

In some implementations, the radiation points 3410 are chips that communicate wirelessly with circuit boards 3420 disposed within the system enclosure 3405. In one embodiment, the cable 3450 is an RF cable and the communication chips 3410 on the cable 3450 are 60 GHz wireless ICs. The RF cable 3450 carries the baseband signal (e.g., up to 30 Gbps). The communication chips disposed on the cable 3450 act as transceivers operating at EHF frequencies, e.g., 60 GHz. When operating as transmitters, the communication chips generate carrier signal (60 GHz) and use the baseband signal carried by the RF cable 3450 to modulate the carrier. The chips radiate the modulated 60 GHz signal to the boards 3420.

When operating as a receiver, the communication chips 3410 receive signals transmitted by the boards 3420 demodulate the received signal, and provide the baseband signal on the cable.

In another embodiment, the cable 3450 is an RF cable and the radiating points 3410 on the cable are antennas coupled to the cable via slots or other means. The RF cable 3450 carries the 60 GHz signal. The antennas on various points directly radiate and receive the 60 GHz signal to or from the boards 3420 in the system.

In another embodiment, the cable 3450 is an optical cable and the radiating points 3410 are optical-electrical converters followed by wireless ICs. The cable 3450 carries the optical signal which acts as a carrier for an EHF modulating signal, e.g., 60 GHz. The EHF signal in turn act as a carrier modulated by the baseband signal. The optical signal at the radiating points 3410 is converted to the EHF electrical signal using optical-electrical converters. The EHF signal is radiated inside the system chassis 3405. The boards 3420 receive the EHF signal and extract the baseband signal.

The boards radiate the baseband signal by first converting the signal into the EHF signal. The cable ICs receive the EHF signal, up convert it to optical frequencies and transmit the data on the cable 3450 as an optical signal for further processing at the intended locations.

Following are a list of items of the present disclosure:

Item 1 is a wireless connector comprising:

a first communication device configured to wirelessly transmit, by radiative coupling, a modulated signal comprising a carrier signal modulated with a digital signal; and a second communication device configured to receive the modulated signal, the first and second communication devices coupled through at least one wired connection that carries a signal used to demodulate the modulated signal.

Item 2 is the wireless connector of item 1, wherein the first communication device is disposed on a first printed circuit board (PCB) substantially enclosed within a housing; and the second communication device is disposed on the first PCB.

Item 3 is the wireless connector of item 1, wherein:

the first communication device is disposed on a first PCB substantially enclosed within a housing; and the second communication device is disposed on a second PCB.

Item 4 is the wireless connector of item 1, wherein the at least one signal used to demodulate the modulated signal comprises a clock signal.

Item 5 is the wireless connector of item 1, wherein the carrier signal has a frequency in a range of 30-300 GHz.

Item 6 is the wireless connector of item 5, wherein the carrier signal is in a range of about 57 to about 64 GHz.

Item 7 is the wireless connector of item 1, wherein the digital signal comprises a multiplexed digital signal.

Item 8 is the wireless connector of item 1, wherein the wireless connector is associated with a connector space between the first communication device and the second communication device through which the first communication device and the second communication device are communicatively coupled by the radiative coupling, the wireless connector further comprising at least one structure configured to reflect signals originating from a source external to the space that would otherwise enter the connector space, to reflect signals originating from a source internal to the connector space that would otherwise exit the connector space, or both.

Item 9 is the wireless connector of item 8, wherein the structure comprises a partition between the connector space of the wireless connector and connector space of an adjacent wireless connector.

Item 10 is the wireless connector of item 8, wherein the structure comprises an enclosure that at least partially encloses the connector space.

Item 11 is the wireless connector of item 1, wherein the first communication device includes at least one first antenna configured to transmit the modulated signal and the second communication device includes at least one second antenna configured to receive the modulated signal.

Item 12 is the wireless connector of item 1, further comprising one or more additional communication devices, wherein each communication device is capable of receiving signals generated by the other communication devices.

Item 13 is a wireless transceiver system, comprising:
a first printed circuit board (PCB) comprising a first transceiver assembly disposed thereon, the first transceiver assembly comprising:
a first modulator for modulating a first carrier signal with a first digital signal to generate a first modulated carrier signal; and
a first transmitter for wirelessly transmitting the first modulated carrier signal; and
a second PCB comprising a second transceiver assembly disposed thereon, the second transceiver assembly comprising:
a first receiver for wirelessly receiving the wirelessly transmitted first modulated carrier signal; and
a first demodulator for demodulating the received first modulated carrier signal to extract the first digital signal,
wherein the first transceiver assembly and the second transceiver assembly are connected through at least one wired connection that carries a signal used in demodulating the received first modulated carrier signal.

Item 14 is the wireless transceiver system of item 13, wherein the first carrier signal is a millimeter wave carrier signal having a frequency in a range from about 30 GHz to about 110 GHz.

Item 15 is the wireless transceiver system of item 13, wherein the first carrier signal is a millimeter wave carrier signal having a frequency greater than about 55 GHz.

Item 16 is the wireless transceiver system of item 13, wherein the first carrier signal is a millimeter carrier signal having frequency in a range from about 55 GHz to about 67 GHz.

Item 17 is the wireless transceiver system of item 13, wherein the first carrier signal is a microwave carrier signal having frequency in a range from about 1 GHz to about 30 GHz.

Item 18 is the wireless transceiver system of item 13, wherein the first carrier signal is an analog signal.

Item 19 is the wireless transceiver system of item 13, wherein the first PCB is electrically connected to the second PCB by one or more connectors.

Item 20 is the wireless transceiver system of item 13, wherein the first PCB faces and is spaced apart from the second PCB, and the first transmitter faces the first receiver.

Item 21 is the wireless transceiver system of item 13, wherein the first PCB communicates to the second PCB via radiating antennas.

Item 22 is the wireless transceiver system of item 13, wherein the first PCB communicates to the second PCB via passive inductive or capacitive coupling.

Item 23 is the wireless transceiver system of item 13, wherein the first modulator modulates the first carrier signal with the first digital signal by at least one of phase, amplitude and frequency modulation.

Item 24 is the wireless transceiver system of item 13, wherein the first transceiver assembly further comprises a first multiplexer for multiplexing a plurality of first digital signals, the first modulator modulating the first carrier signal with each first digital signal in the plurality of first digital signals to generate the first modulated carrier signal.

Item 25 is the wireless transceiver system of item 13, wherein the first PCB further comprises a first electronic device disposed thereon, the first electronic device generating the first digital signal.

Item 26 is a wireless transceiver system, comprising:
a first printed circuit board (PCB) comprising a plurality of first transceivers disposed thereon, each first transceiver being adapted to modulate a first carrier signal with a first digital signal to generate a first modulated carrier signal and wirelessly transmit the first modulated carrier signal; and
a second PCB comprising a plurality of second transceivers disposed thereon, each second transceiver being adapted to modulate a second carrier signal with a second digital signal to generate a second modulated carrier signal and wirelessly transmit the second modulated carrier signal;
each first transceiver corresponding to a different second transceiver, each first transceiver being adapted to wirelessly receive the second modulated signal wirelessly transmitted by the second transceiver corresponding to the first transceiver and demodulate the received second modulated carrier signal to extract the second digital signal, each second transceiver being adapted to wirelessly receive the first modulated signal wirelessly transmitted by the first transceiver corresponding to the second transceiver and demodulate the received first modulated carrier signal to extract the first digital signal.

Item 27 is the wireless transceiver system of item 26, wherein each first transceiver and its corresponding second transceiver are shielded from the rest of first and second transceivers.

Item 28 is the wireless transceiver system of item 26, wherein each first transceiver is closest to its corresponding second transceiver.

Item 29 is a wireless transceiver system, comprising:
a first printed circuit board (PCB) comprising a plurality of first transceivers disposed thereon, each first transceiver being adapted to modulate a first carrier signal with a first digital signal to generate a first modulated carrier signal and wirelessly transmit the first modulated carrier signal; and
a second PCB comprising a plurality of second transceivers disposed thereon, each second transceiver being adapted to modulate a second carrier signal with a second digital signal to generate a second modulated carrier signal and wirelessly transmit the second modulated carrier signal;
each first transceiver corresponding to a different second transceiver, each first transceiver being adapted to wirelessly receive the second modulated signal wirelessly transmitted by the second transceiver corresponding to the first transceiver and demodulate the received second modulated carrier signal to extract the second digital signal, each second transceiver being adapted to wirelessly receive the first modulated signal wirelessly transmitted by the first transceiver corresponding to the second transceiver and demodulate the received first modulated carrier signal to extract the first digital signal; and
an insulating structure inserted between the first PCB and the second PCB.

Item 30 is the wireless transceiver system of item 29, wherein the insulating structure comprises sections of lower loss and higher loss materials in a recurring fashion such that the lower loss material is inserted in between each first transceiver and its corresponding second transceiver and the high loss material divides the sections of lossless materials.

Item 31 is the wireless transceiver system of item 29, wherein the insulating structure comprises sections of materials with higher permittivity and lower permittivity such that the material with higher permittivity is inserted between each first transceiver and its corresponding second transceiver and the material with lower permittivity divides the sections of higher permittivity values.

Item 32 is the wireless transceiver system of item 29, wherein the insulating structure comprises sections of materials with higher permittivity low loss with air gaps such that the material with higher permittivity is inserted between each transceiver and its corresponding second transceiver and the air gaps divide the sections of higher permittivity.

Item 33 is the wireless transceiver system of item 29, wherein the insulating structure comprises sections of dielectric materials separated by conductive walls, such that the dielectric material is inserted between each first transceiver and its corresponding second transceiver and the conducting material divides the sections of the dielectric materials.

Item 34 is the wireless transceiver system of item 29, wherein the insulating structure comprises sections of air gaps separated by conductive walls, such that the air gaps are inserted between each first transceiver and its corresponding second transceiver and the conducting material divides the sections of the air gaps.

Item 35 is an electronic system comprising:
a plurality of printed circuit boards (PCBs) disposed within a housing of the electronic system, each PCB comprising a plurality of transceivers configured to wirelessly transmit and receive modulated carrier signals; and
each transceiver in the system is configured to receive signals transmitted by every other transceiver in the system.

Item 36 is the wireless transceiver system of item 35, wherein each transceiver is identified with a unique network address;

Item 37 is the wireless transceiver system of item 35, wherein the transceiver system is configured to implement one or more of code division multiplexing, space division multiplexing, time division multiplexing, frequency division multiplexing, token ring, multiple-input-multiple-output, orthogonal frequency division multiplexing, Aloha, slotted Aloha, carrier sense multiple access with or without collision avoidance or other multiplexing and channel access schemes.

Item 38 is the wireless transceiver system of item 35, wherein one of the transceivers acts as a master device configured to control transmission of the modulated carrier signals by the other transceivers.

Item 39 is the wireless transceiver system of item 35, wherein each transceiver transmits independently of every other transceiver.

Item 40 is the wireless transceiver system of item 35, wherein each transceiver of a PCB transmits:
the same carrier frequency modulated with the same digital data
the same carrier frequency modulated with different digital data,
a different carrier frequency modulated with the same digital data, or
a different carrier frequency modulated with a different modulating data.

Item 41 is an electronic system comprising:
a housing with multiple sections within the housing;
a plurality of transceivers arranged within each of the multiple sections, the plurality of transceivers disposed on one or more printed circuit boards (PCBs), each of the transceivers of the plurality of transceivers configured to transmit and receive modulated carrier signals modulated by digital data, wherein each of the plurality of transceivers arranged with in each section is configured to receive modulated carrier signals transmitted by each of the other transceivers of the plurality of transceivers.

Item 42 is the electronic system of item 41, further comprising structures configured to substantially isolate the plurality of transceivers in one of the multiple sections from signals transmitted by any of the plurality of transceivers in another one of the multiple sections.

Item 43 is the electronic system of item 41, wherein a transceiver in one section can identify signals received from transceivers located in other sections.

Item 44 is the electronic system of item 41, wherein one plurality of transceivers in one section uses a different carrier frequency from another plurality of transceivers in another section.

Item 45 is the wireless transceiver system of item 41, wherein one plurality of transceivers in one section is coupled by an electrical or optical cable to other pluralities of transceivers arranged in other sections.

Item 46 is an electronic system comprising:
a plurality of printed circuit boards (PCBs), each PCB comprising a first transceiver configured to wirelessly transmit a first carrier signal modulated by a first signal; and
a cable spaced apart from each PCB in the plurality of PCBs and comprising a plurality of spaced apart radiation points disposed thereon, each radiation point being adapted to wirelessly transmit a second carrier signal modulated by a second digital signal and to receive the first carrier signal modulated by the first digital signal.

Item 47 is the electronic system of item 46, wherein:
the cable comprises an electrical cable configured to carry the second digital signal; and
the radiation points comprise transceivers configured to modulate the second carrier signal with the second digital signal and to demodulate the first carrier signal modulated with the first digital signal.

Item 48 is the electronic system of item 46, wherein the cable is capable of carrying the carrier frequency signals and a plurality of transmitting/receiving antennas disposed on the cable.

Item 49 is the electronic system of item 46, wherein the cable is an optical cable and a plurality of opto-electrical devices are disposed on the cable.

The embodiments discussed in this disclosure have been illustrated and described herein for purposes of description of preferred embodiments, it will be appreciated by those of ordinary skill in the art that a wide variety of alternate and/or equivalent implementations intended to achieve the same purposes may be substituted for the specific embodiments shown and described herein without departing from the scope of the present invention. Those with skill in the mechanical, electro-mechanical, and electrical arts will readily appreciate that the disclosed embodiments may be implemented with wide variations. This disclosure is intended to cover any adaptations or variations of the embodiments discussed herein.

What is claimed is:

1. A wireless transceiver system, comprising:
a plurality of printed circuit boards (PCBs) disposed within a housing of an electronic system, the plurality of PCBs comprising:
a first PCB comprising a plurality of first transceivers disposed thereon, each first transceiver being adapted to modulate a first carrier signal with a first digital signal to generate a first modulated carrier signal and wirelessly transmit the first modulated carrier signal, through space within the housing; and
a second PCB comprising a plurality of second transceivers disposed thereon, each second transceiver being adapted to modulate a second carrier signal with a second digital signal to generate a second modulated carrier signal and wirelessly transmit the second modulated carrier signal, through the space within the housing;

each first transceiver corresponding to a different second transceiver, each first transceiver being adapted to wirelessly receive the second modulated signal wirelessly transmitted by the second transceiver corresponding to the first transceiver and demodulate the received second modulated carrier signal to extract the second digital signal, each second transceiver being adapted to wirelessly receive the first modulated signal wirelessly transmitted by the first transceiver corresponding to the second transceiver and demodulate the received first modulated carrier signal to extract the first digital signal; and a signal shield structure disposed between the first PCB and the second PCB, the signal shield structure configured to shield signals between each first transceiver disposed on the first PCB and its corresponding second transceiver disposed on the second PCB from signals between other first and second transceivers within the housing.

2. The wireless transceiver system of claim 1, wherein each first transceiver and its corresponding second transceiver are shielded from the rest of first and second transceivers by an isolating structure comprising a lower loss or higher permittivity material disposed in between each first transceiver and its corresponding second transceiver and a higher loss or lower permittivity material disposed between the lower loss or higher permittivity material.

3. A wireless transceiver system, comprising:
a first printed circuit board (PCB) comprising a plurality of first transceivers disposed thereon, each first transceiver being adapted to modulate a first carrier signal with a first digital signal to generate a first modulated carrier signal and wirelessly transmit the first modulated carrier signal; and a second PCB comprising a plurality of second transceivers disposed thereon, each second transceiver being adapted to modulate a second carrier signal with a second digital signal to generate a second modulated carrier signal and wirelessly transmit the second modulated carrier signal;

each first transceiver corresponding to a different second transceiver, each first transceiver being adapted to wirelessly receive the second modulated signal wirelessly transmitted by the second transceiver disposed on the second PCB corresponding to the first transceiver disposed on the first PCB and demodulate the received second modulated carrier signal to extract the second digital signal, each second transceiver being adapted to wirelessly receive the first modulated signal wirelessly transmitted by the first transceiver disposed on the first PCB corresponding to the second transceiver disposed on the second PCB and demodulate the received first modulated carrier signal to extract the first digital signal; and a structure between the first PCB and the second PCB, the structure comprising a first material and a second material, arranged in a manner that a region between the first and second PCBs is divided into sections by the first material and the second material is disposed between the first material and within the sections, wherein the first material is at least one of a higher loss material, a lower permittivity material, and air and the second material is at least one of a lower loss material and a higher permittivity material.

4. The wireless transceiver system of claim 3, wherein the second material is the lower loss material and the first material is the higher loss material.

5. The wireless transceiver system of claim 3, wherein the second material is the higher permittivity material and the first material is the lower permittivity material.

6. The wireless transceiver system of claim 3, wherein the second material is a higher permittivity low loss material and the first material is the air.

7. The wireless transceiver system of claim 3, wherein one of the transceivers acts as a master device configured to control transmission of the modulated carrier signals by another transceiver.

8. The wireless transceiver system of claim 3, wherein each transceiver transmits independently of every other transceiver.

9. The system of claim 3, wherein the second material is air and the first material is a conductive material.

10. An electronic system comprising:
a housing with multiple sections within the housing;
a plurality of transceivers arranged within each of the multiple sections, the plurality of transceivers disposed on one or more printed circuit boards (PCBs), each of the transceivers of the plurality of transceivers configured to transmit and receive modulated carrier signals modulated by digital data through space within the housing, wherein each of the plurality of transceivers arranged within each section is configured to receive modulated carrier signals transmitted by each of the other transceivers of the plurality of transceivers; and
at least one structure disposed within the housing configured to isolate signals transmitted by the plurality of transceivers in one of the multiple sections from signals transmitted by the plurality of transceivers in another one of the multiple sections,
wherein the structure includes a first material and a second material, different from the first material, the first and second materials arranged in a manner that a region between two adjacent PCBs is divided into sections by the first material and the second material is disposed between the first material and within the sections.

11. The electronic system of claim 10, wherein one plurality of transceivers in one section uses a different carrier frequency from another plurality of transceivers in another section.

12. The system of claim 10, wherein the structure includes a surface disposed at an angle to the first and second transceivers.

13. The system of claim 12, wherein the surface is configured to reflect signals between the first and second transceivers and to attenuate signals from the other first and second transceivers.

14. The system of claim 10, wherein the structure is a hollow structure.

15. The system of claim 10, wherein the structure is a solid structure.

16. The system of claim 10, wherein the second material is a lower loss material and the first material is a higher loss material.

17. The system of claim 10, wherein the second material is a higher permittivity material and the first material is a lower permittivity material.

18. The system of claim 10, wherein the second material is a higher permittivity, low loss material and the first material is air.

19. The system of claim 10, wherein the second material is air and the first material is a conductive material.

* * * * *